(12) United States Patent
Akiyama

(10) Patent No.: US 12,375,192 B2
(45) Date of Patent: Jul. 29, 2025

(54) DATA COMPRESSION APPARATUS, DATA DECOMPRESSION APPARATUS, DATA COMPRESSION SYSTEM, CONTROL CIRCUIT, STORAGE MEDIUM, DATA COMPRESSION METHOD, AND DATA DECOMPRESSION METHOD

(71) Applicant: Mitsubishi Electric Corporation, Tokyo (JP)

(72) Inventor: Yuji Akiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 328 days.

(21) Appl. No.: 17/984,368

(22) Filed: Nov. 10, 2022

(65) Prior Publication Data
US 2023/0062385 A1    Mar. 2, 2023

Related U.S. Application Data

(63) Continuation of application No. PCT/JP2020/042964, filed on Nov. 18, 2020.

(30) Foreign Application Priority Data

Nov. 18, 2020    (WO) .................. PCT/JP2020/021623

(51) Int. Cl.
  *H04B 17/21*    (2015.01)
  *H04B 17/12*    (2015.01)
  *H04B 17/318*   (2015.01)

(52) U.S. Cl.
  CPC ............. *H04B 17/21* (2015.01); *H04B 17/12* (2015.01); *H04B 17/318* (2015.01)

(58) Field of Classification Search
  CPC ...... H04B 17/21; H04B 17/12; H04B 17/318; H04B 1/662; H04B 1/667; H04B 17/364;
  (Continued)

(56) References Cited

U.S. PATENT DOCUMENTS 9,075,446 B2    7/2015 Garudadri et al.
9,658,825 B2    5/2017 Garudadri et al.
(Continued)

FOREIGN PATENT DOCUMENTS

JP            6038981 B2    11/2016
WO    WO 2014/191712 A1    12/2014
(Continued)

OTHER PUBLICATIONS

U.S. Appl. No. 18/664,693, filed May 15, 2024.
(Continued)

*Primary Examiner* — Don N Vo
(74) *Attorney, Agent, or Firm* — Birch, Stewart, Kolasch & Birch, LLP

(57) ABSTRACT

A data compression apparatus includes a receiver that outputs sampling sequences corresponding to signals obtained by adding different delay times to different signals obtained by branching a target signal into a plurality of lines, and sampling the signals at a sampling rate less than the Nyquist rate, and an encoder that converts the sampling sequences into compressed data. The encoder includes a sub-FFT that converts the sampling sequences into frequency-domain signals, a signal processing unit that performs, at one time, phase compensation processing for sub-Nyquist zones of the sampling sequences, and processing to cancel phase rotation, a target frequency estimator that determines into which sub-Nyquist zone the target signal has been folded and estimates the frequency of the target signal, and an encoding unit that converts a value representing the sub-Nyquist zone and the corresponding amplitude value into the compressed data and output the compressed data.

20 Claims, 19 Drawing Sheets

(58) Field of Classification Search
CPC .... G01S 7/2923; G01S 7/356; H03M 7/3062; H03M 7/3068
USPC ............. 455/67.11; 375/240; 370/240
See application file for complete search history.

(56) References Cited

U.S. PATENT DOCUMENTS

| | | | | |
|---|---|---|---|---|
| 2001/0006540 | A1* | 7/2001 | Kim | H04L 25/0232 375/343 |
| 2009/0201950 | A1* | 8/2009 | Kakura | H04L 1/0001 370/477 |
| 2014/0164000 | A1* | 6/2014 | Schuller | G10L 19/16 704/500 |
| 2016/0308697 | A1* | 10/2016 | Gattami | H04L 25/03834 |
| 2020/0403841 | A1* | 12/2020 | Higashinaka | H04B 1/69 |
| 2022/0224365 | A1 | 7/2022 | Akiyama | |
| 2023/0062385 | A1 | 3/2023 | Akiyama | |
| 2024/0295593 | A1 | 9/2024 | Akiyama | |

FOREIGN PATENT DOCUMENTS

| | | | |
|---|---|---|---|
| WO | WO 2016/186998 | A1 | 11/2016 |
| WO | WO 2021/117168 | A1 | 6/2021 |
| WO | WO 2021/245753 | A1 | 12/2021 |

OTHER PUBLICATIONS

Extended European Search Report for European Application No. 20939240.6, dated May 6, 2024.
Romero et al., "Analog-to-Information Conversion by Encoded Multi-Cosets", International Journal of Electronics Letters, vol. 8, No. 3, Apr. 22, 2019, XP093140861, pp. 318-328.
International Search Report, issued in PCT/JP2021/045613, PCT/ISA/210, dated Jan. 25, 2022.
International Search Report (PCT/ISA/210) issued in PCT/JP2020/042964, dated Feb. 16, 2021.
Written Opinion of the International Searching Authority (PCT/ISA/237) issued in PCT/JP2020/042964, dated Feb. 16, 2021.
Yaghoobi et al., "An Efficient Implementation of the Low-Complexity Multi-Coset Sub-Nyquist Wideband Radar Electronic Surveillance", Sensor Signal Processing for Defence, IEEE, 2014, 5 pages.
Extended European Search Report for European Application No. 21967272.2, dated Jan. 3, 2025.

* cited by examiner

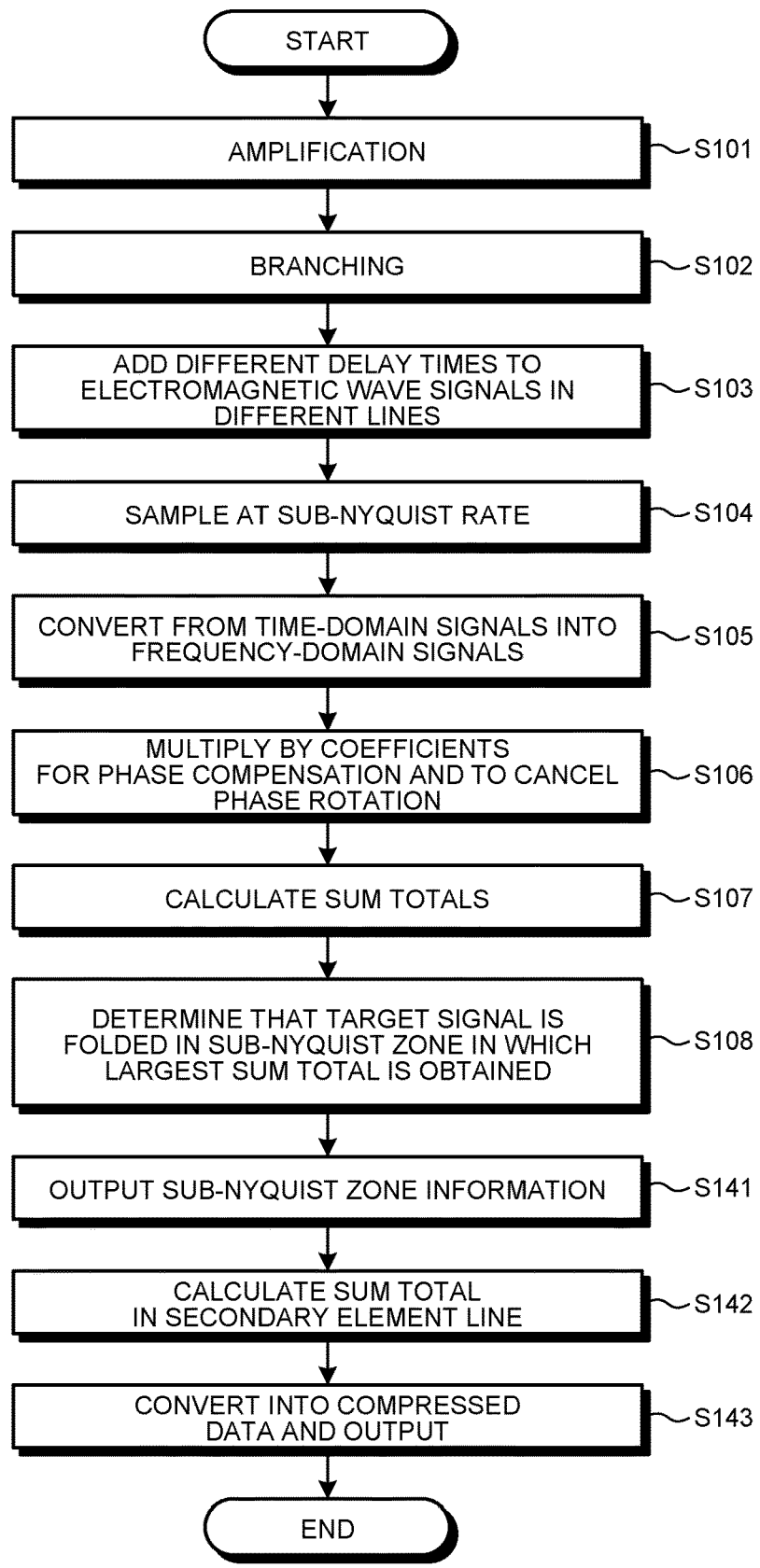

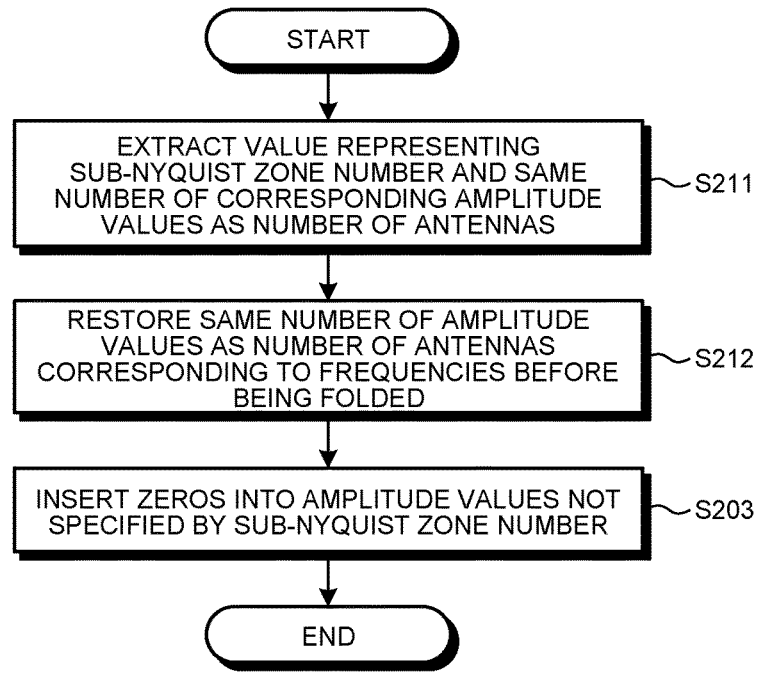
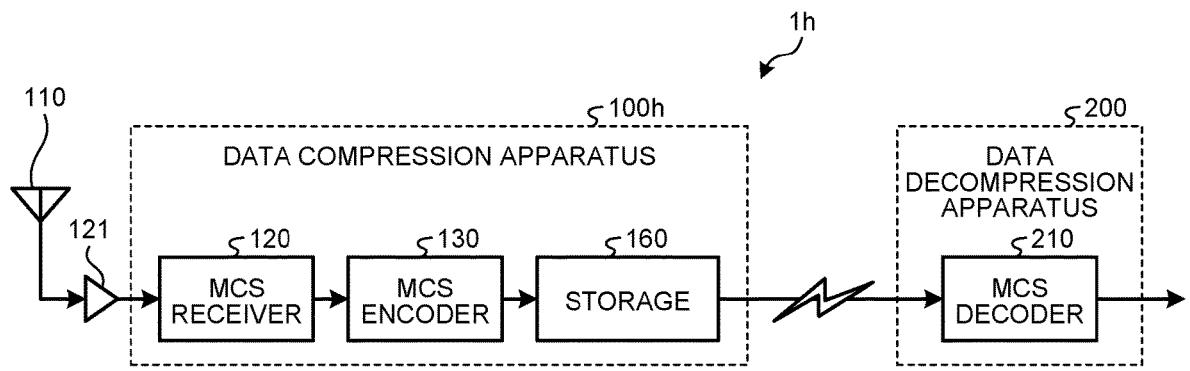

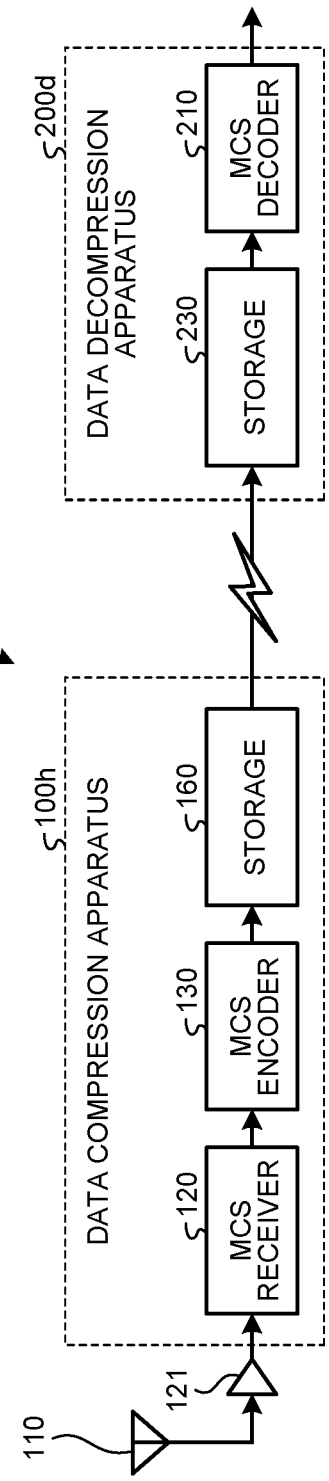

DATA COMPRESSION APPARATUS, DATA DECOMPRESSION APPARATUS, DATA COMPRESSION SYSTEM, CONTROL CIRCUIT, STORAGE MEDIUM, DATA COMPRESSION METHOD, AND DATA DECOMPRESSION METHOD

CROSS-REFERENCE TO RELATED APPLICATION

This application is a continuation application of International Application PCT/JP2020/042964, filed on Nov. 18, 2020, which claims priority under 35 U.S.C. 119(a) to Patent Application No. PCT/JP2020/021623, filed in Japan on Jun. 1, 2020, all of which are hereby expressly incorporated by reference into the present application.

BACKGROUND OF THE INVENTION

1. Field of the Invention

The present disclosure relates to a data compression apparatus that compresses data, a data decompression apparatus, a data compression system, a control circuit, a storage medium, a data compression method, and a data decompression method.

2. Description of the Related Art

In general, a sparse signal with many component values whose magnitudes can be represented by zero or values small enough to be regarded as zero by selecting a proper basis can be efficiently represented by the values of a small number of components that are not regarded as zero under the selected basis. A technique using compressed sensing is considered as a method using this characteristic to convert sampling sequence data obtained by sampling a sparse signal with an analog-to-digital converter (ADC) into a compressed data format based on the values of a small number of components that are not regarded as zero.

For example, Japanese Patent No. 6038981 discloses a technique called sparse reconstruction to represent a sparse signal with fewer variables by iteratively optimizing the fidelity and sparsity of compressed representation.

However, the above conventional technique has a very large computational load in optimization processing to search for a combination of a proper basis and its component values in compressed sensing. For example, there is a problem that processing of a broadband signal with 1 GS/s or more is impractical.

SUMMARY OF THE INVENTION

To solve the problem and achieve the object described above, a data compression apparatus according to the present disclosure includes a receiver to output sampling sequences corresponding to signals obtained by adding different delay times to different signals obtained by branching a target signal into a plurality of lines, and sampling the signals at a sampling rate less than a Nyquist rate, and an encoder to convert the sampling sequences into compressed data and output the compressed data. The encoder includes a time-frequency transform unit to convert the sampling sequences in the lines from time-domain signals into frequency-domain signals, a signal processing unit to perform, at one time, phase compensation processing for sub-Nyquist zones of the sampling sequences converted into the frequency-domain signals, and processing to cancel phase rotation due to delay time differences between the sampling sequences, a target frequency estimator to determine into which sub-Nyquist zone the target signal has been folded and estimate a frequency of the target signal, and an encoding unit to convert a value representing the sub-Nyquist zone and a corresponding amplitude value into the compressed data in a specified data format and output the compressed data.

BRIEF DESCRIPTION OF THE DRAWINGS

FIG. 21 is a flowchart illustrating the operation of the data compression apparatus according to the eleventh embodiment;

FIG. 22 is a flowchart illustrating the operation of a data decompression apparatus according to the eleventh embodiment;

FIG. 23 is a first diagram illustrating a configuration example of a data compression system according to a twelfth embodiment; and FIG. 24 is a second diagram illustrating a configuration example of a data compression system according to the twelfth embodiment.

DETAILED DESCRIPTION OF THE PREFERRED EMBODIMENTS

Hereinafter, a data compression apparatus, a data decompression apparatus, a data compression system, a control circuit, a storage medium, a data compression method, and a data decompression method according to embodiments of the present disclosure will be described in detail with reference to the drawings.

First Embodiment

Figure 1:
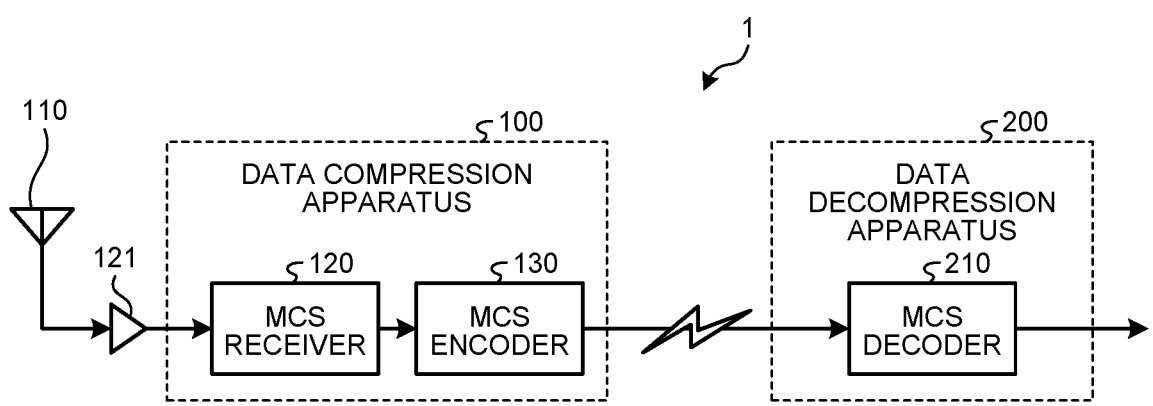
FIG. 1 is a diagram illustrating a configuration example of a data compression system according to a first embodiment.

FIG. 1 is a diagram illustrating a configuration example of a data compression system 1 according to a first embodiment. The data compression system 1 includes a data compression apparatus 100 and a data decompression apparatus 200.

The data compression apparatus 100 includes an MCS receiver 120 and an MCS encoder 130. In the preceding stage of the data compression apparatus 100, an antenna 110 receives an electromagnetic wave signal. An amplifier 121 amplifies a target signal that is an electromagnetic wave signal received by the antenna 110. In the data compression apparatus 100, the MCS receiver 120 is a receiver that converts a target signal that is an electromagnetic wave signal received by the antenna 110 and amplified by the amplifier 121 into a plurality of sampling sequences. Specifically, the MCS receiver 120 outputs sampling sequences corresponding to signals obtained by adding different delay times to different signals obtained by branching a target signal into a plurality of lines and sampling the signals at a sampling rate less than the Nyquist rate. The MCS encoder 130 is an encoder that converts sampling sequences converted by the MCS receiver 120 into compressed data and outputs the compressed data to the data decompression apparatus 200.

The data decompression apparatus 200 includes an MCS decoder 210. In the data decompression apparatus 200, the MCS decoder 210 decodes compressed data acquired from the data compression apparatus 100 into an amplitude value corresponding to a frequency before a target signal is folded by the data compression apparatus 100. Here, the expression "a target signal is folded" means that when the target signal is a sparse signal, the target signal is represented by a small number of components that are not regarded as zero under a selected basis.

Figure 2:
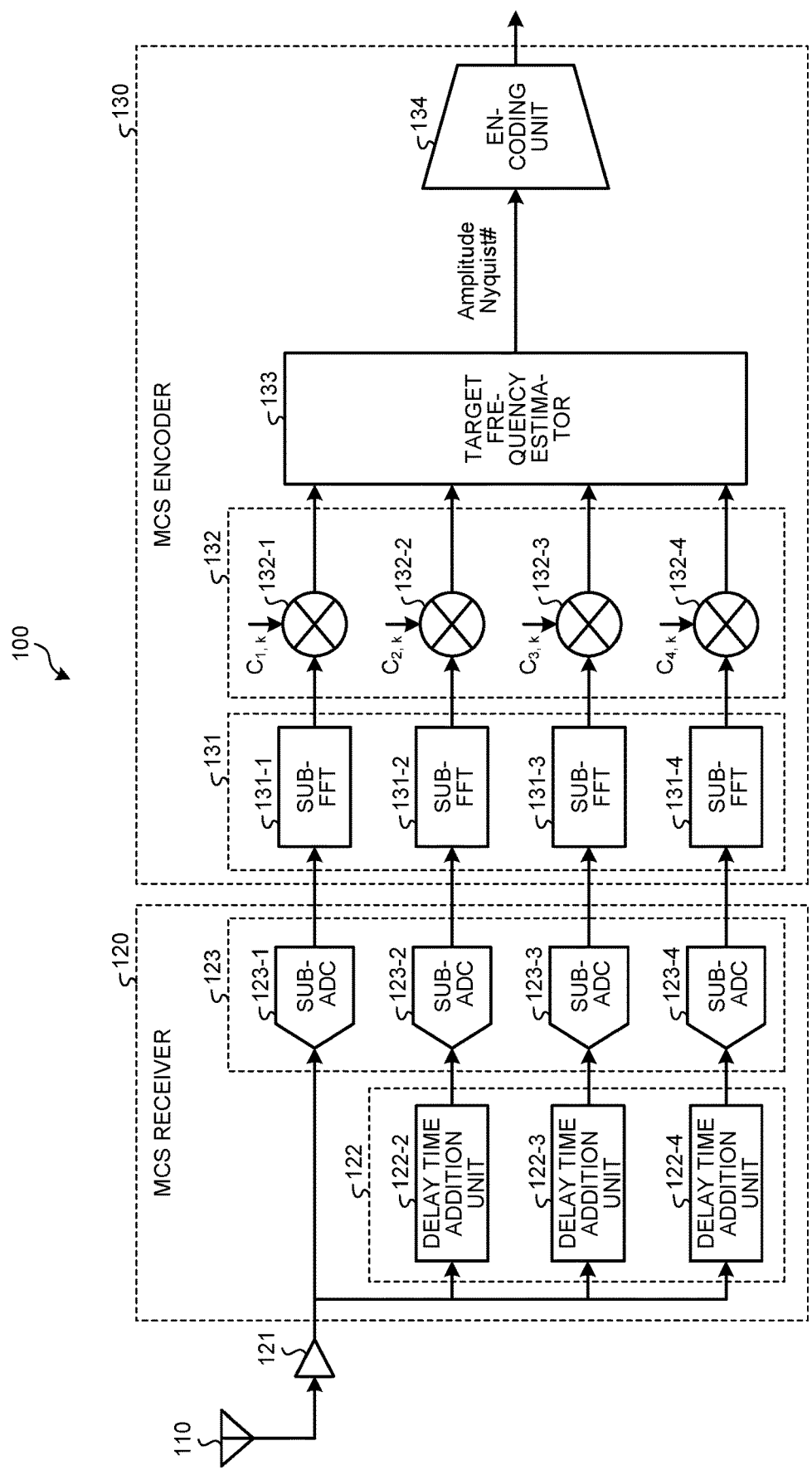
FIG. 2 is a diagram illustrating a configuration example of a data compression apparatus according to the first embodiment.
Figure 3:
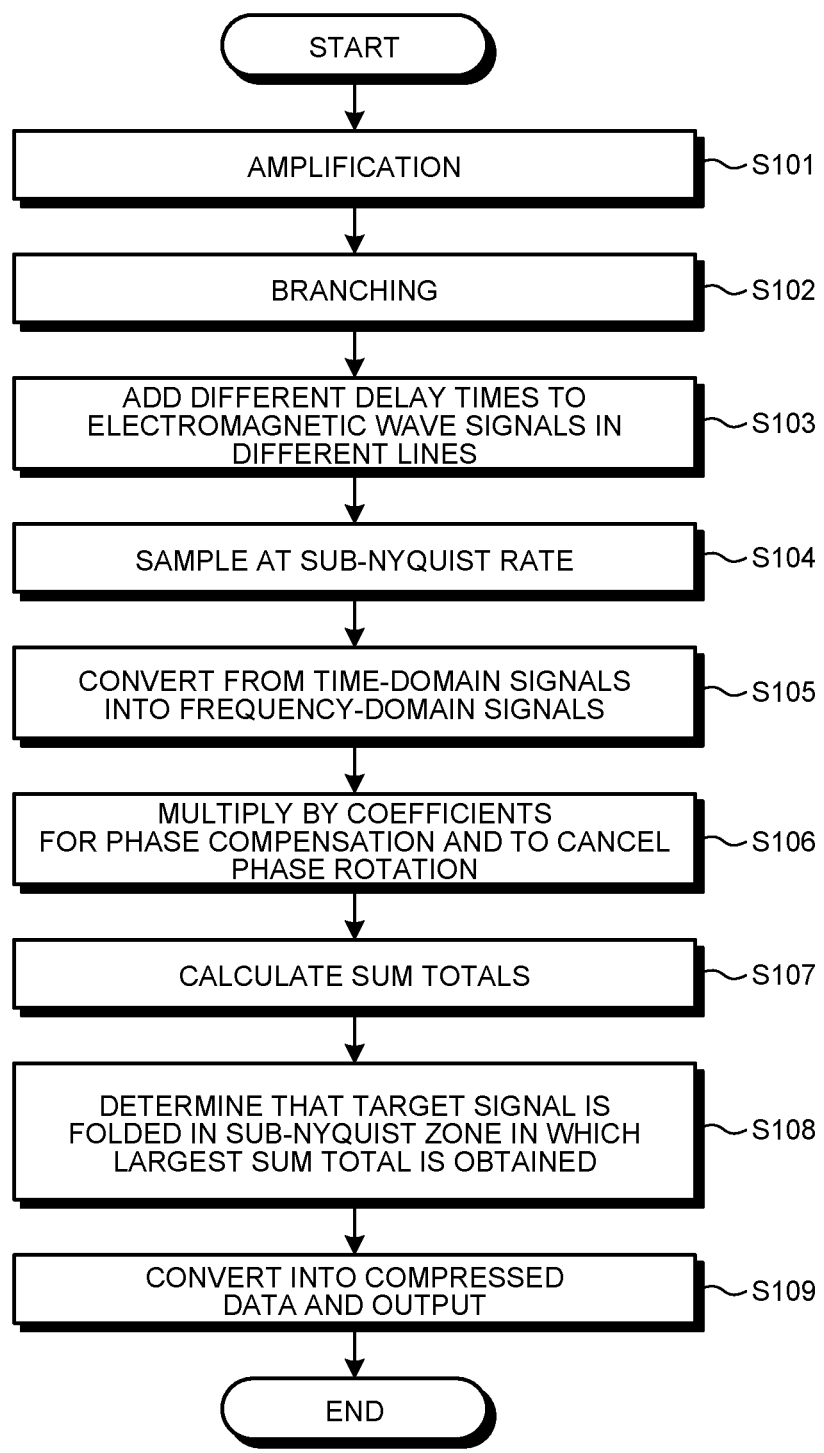
FIG. 3 is a flowchart illustrating the operation of the data compression apparatus according to the first embodiment.

First, the configuration and operation of the data compression apparatus 100 will be described. FIG. 2 is a diagram illustrating a configuration example of the data compression apparatus 100 according to the first embodiment. FIG. 3 is a flowchart illustrating the operation of the data compression apparatus 100 according to the first embodiment. In FIG. 2, the antenna 110 and the amplifier 121 in the preceding stage are also illustrated. The same applies to the drawings of configuration examples of the data compression apparatus in the following embodiments. In FIG. 3, for convenience of explanation, the operation of the amplifier 121 in the preceding stage of the data compression apparatus 100 is included. The same applies to the flowcharts of the data compression apparatus in the following embodiments. As described above, the data compression apparatus 100 includes the MCS receiver 120 and the MCS encoder 130. The MCS receiver 120 includes delay time addition units 122-2 to 122-4 and sub-ADCs 123-1 to 123-4. The MCS encoder 130 includes sub-fast Fourier transforms (FFTs) 131-1 to 131-4, signal processing units 132-1 to 132-4, a target frequency estimator 133, and an encoding unit 134.

In the preceding stage of the data compression apparatus 100, the amplifier 121 amplifies a target signal that is an electromagnetic wave signal received by the antenna 110 (step S101). In the data compression apparatus 100, the MCS receiver 120 branches the target signal amplified by the amplifier 121 into four lines, that is, four signals (step S102).

The delay time addition units 122-2 to 122-4 add different delay times to the signals, based on the signal in the line output from the amplifier 121 to the sub-ADC 123-1 (step S103). For example, the delay time addition units 122-2 to 122-4 may each add a different delay time using a delay element, or may each add a different delay time using a track-and-hold circuit. The delay time addition units 122-2 to 122-4 are collectively referred to as a delay time addition unit 122. The delay time addition unit 122 adds different delay times to different signals obtained by branching a target signal into a plurality of lines. The delay time addition unit 122 may be configured to be able to add a delay time also to a signal in the line output from the amplifier 121 to the sub-ADC 123-1. In this case, the delay time addition unit 122 adds a delay time of zero to the signal in the line output from the amplifier 121 to the sub-ADC 123-1.

Each of the sub-ADCs 123-1 to 123-4 independently performs sampling at a sampling rate that is a sub-Nyquist rate of 1/20 of the Nyquist rate. Specifically, the sub-ADC 123-1 samples the signal output from the amplifier 121. The sub-ADC 123-2 samples the target signal in the line output from the delay time addition unit 122-2. The sub-ADC 123-3 samples the target signal in the line output from the delay time addition unit 122-3. The sub-ADC 123-4 samples the target signal in the line output from the delay time addition unit 122-4 (step S104). The sub-ADCs 123-1 to 123-4 are collectively referred to as a sub-ADC 123. The sub-ADC 123 is a sub-sampling unit that samples signals at a sampling rate less than the Nyquist rate and outputs sampling sequences.

In the MCS encoder 130, the sub-FFTs 131-1 to 131-4 perform processing to convert the sampling sequences sub-Nyquist sampled by the corresponding sub-ADCs 123-1 to 123-4 into signals folded in the frequency domain. Specifically, the sub-FFT 131-1 converts the sampling sequence from the sub-ADC 123-1 from a time-domain signal into a frequency-domain signal. The sub-FFT 131-2 converts the sampling sequence from the sub-ADC 123-2 from a time-domain signal into a frequency-domain signal. The sub-FFT 131-3 converts the sampling sequence from the sub-ADC 123-3 from a time-domain signal into a frequency-domain signal. The sub-FFT 131-4 converts the sampling sequence from the sub-ADC 123-4 from a time-domain signal into a frequency-domain signal (step S105). The sub-FFTs 131-1 to 131-4 are collectively referred to as a sub-FFT 131. The sub-FFT 131 is a time-frequency transform unit that converts sampling sequences in different lines from time-domain signals into frequency-domain signals.

The signal processing units 132-1 to 132-4 multiply the frequency-domain signals converted by the corresponding sub-FFTs 131-1 to 131-4 by coefficients for phase compensation for individual sub-Nyquist zones of the number of sub-Nyquist folds K corresponding to twenty, the ratio between the sub-Nyquist rate and the Nyquist rate, and to cancel phase rotation due to the delay time differences (step S106). As illustrated in FIG. 2, the coefficients are $C_{1,k}$ by which the signal processing unit 132-1 multiplies the frequency-domain signal from the sub-FFT 131-1, $C_{2,k}$ by which the signal processing unit 132-2 multiplies the frequency-domain signal from the sub-FFT 131-2, $C_{3,k}$ by which the signal processing unit 132-3 multiplies the frequency-domain signal from the sub-FFT 131-3, and $C_{4,k}$ by which the signal processing unit 132-4 multiplies the frequency-domain signal from the sub-FFT 131-4. Here, k=1, 2, ..., K. The signal processing units 132-1 to 132-4 are collectively referred to as a signal processing unit 132. The signal processing unit 132 performs, at one time, phase compensation processing for the sub-Nyquist zones of sampling sequences converted into frequency-domain signals, and processing to cancel phase rotation due to delay time differences between the sampling sequences.

The target frequency estimator 133 calculates the sum total of values obtained by the multiplication by the coefficients $C_{1,k}$, $C_{2,k}$, $C_{3,k}$, and $C_{4,k}$ for each sub-Nyquist zone, that is, for each identical sub-Nyquist zone number k in the signal processing units 132-1 to 132-4 (step S107). The target frequency estimator 133 determines a sub-Nyquist zone in which the target signal is present, that is, folded. Specifically, the target frequency estimator 133 determines that the target signal is folded in the sub-Nyquist zone in which the largest sum total is obtained (step S108). Thus, the target frequency estimator 133 determines into which sub-Nyquist zone the target signal has been folded, and estimates the frequency of the target signal.

The encoding unit 134 converts a value representing the sub-Nyquist zone and the corresponding amplitude value into compressed data in a specified data format, and outputs the compressed data (step S109).

Figure 4:
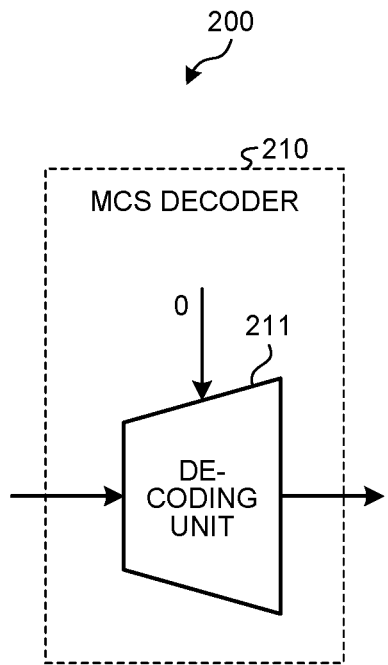
FIG. 4 is a diagram illustrating a configuration example of a multi-coset sampling (MCS) decoder included in a data decompression apparatus according to the first embodiment.
Figure 5:
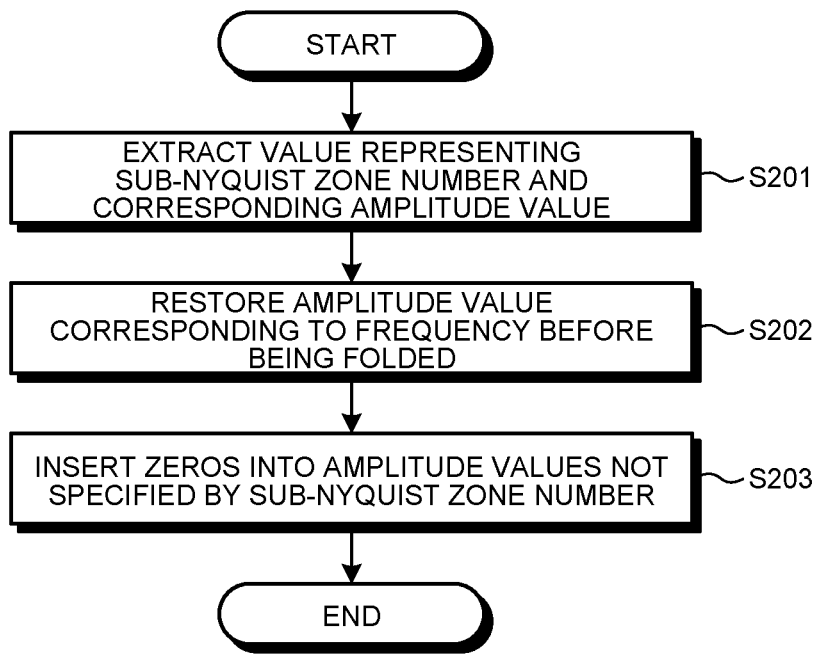
FIG. 5 is a flowchart illustrating the operation of the data decompression apparatus according to the first embodiment.

Next, the configuration and operation of the data decompression apparatus 200 will be described. FIG. 4 is a diagram illustrating a configuration example of the MCS decoder 210 included in the data decompression apparatus 200 according to the first embodiment. FIG. 5 is a flowchart illustrating the operation of the data decompression apparatus 200 according to the first embodiment. In the data decompression apparatus 200, the MCS decoder 210 includes a decoding unit 211. The decoding unit 211 acquires the compressed data output from the encoding unit 134 of the data compression apparatus 100, and extracts the value representing the sub-Nyquist zone number k and the corresponding amplitude value from the compressed data (step S201). The decoding unit 211 restores an amplitude value corresponding to a frequency before being folded in the data compression apparatus 100, using the value representing the sub-Nyquist zone number k and the corresponding amplitude value extracted (step S202). The decoding unit 211 inserts zeros as component values into amplitude values corresponding to frequencies not specified by the sub-Nyquist zone number k (step S203).

Thus, the MCS decoder 210 extracts the value representing the sub-Nyquist zone and the corresponding amplitude value from the compressed data acquired from the data compression apparatus 100, and restores the amplitude value corresponding to the frequency before the target signal is folded in the data compression apparatus 100.

Next, a hardware configuration of the data compression apparatus 100 will be described. In the data compression apparatus 100, the MCS receiver 120 and the MCS encoder 130 are implemented by processing circuitry. The processing circuitry may be a processor that executes a program stored in memory and the memory, or may be dedicated hardware. The processing circuitry is also referred to as a control circuit.

Figure 6:
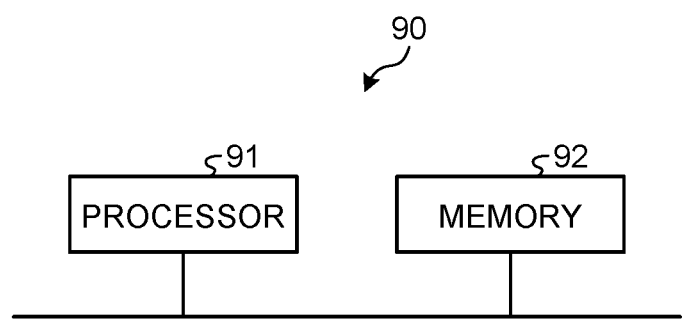
FIG. 6 is a diagram illustrating a configuration example of processing circuitry when processing circuitry included in the data compression apparatus according to the first embodiment is implemented by a processor and memory.

FIG. 6 is a diagram illustrating a configuration example of processing circuitry 90 when the processing circuitry included in the data compression apparatus 100 according to the first embodiment is implemented by a processor and memory. The processing circuitry 90 illustrated in FIG. 6 is a control circuit and includes a processor 91 and memory 92. When the processor 91 and the memory 92 constitute the processing circuitry 90, the functions of the processing circuitry 90 are implemented by software, firmware, or a combination of software and firmware. The software or firmware is described as a program and stored in the memory 92. In the processing circuitry 90, the processor 91 reads and executes the program stored in the memory 92, thereby implementing the functions. That is, the processing circuitry 90 includes the memory 92 for storing the program that results in the execution of the processing in the data compression apparatus 100. This program can be said to be a program for causing the data compression apparatus 100 to execute the functions implemented by the processing circuitry 90. This program may be provided by a storage medium in which the program is stored, or may be provided by other means such as a communication medium.

The program can be said to be a program that causes the data compression apparatus 100 to perform a first step of outputting, by the MCS receiver 120, sampling sequences corresponding to signals obtained by adding different delay times to different signals obtained by branching a target signal into a plurality of lines, and sampling the signals at a sampling rate less than the Nyquist rate, and a second step of converting, by the MCS encoder 130, the sampling sequences into compressed data and outputting the compressed data, and causes the data compression apparatus 100 to perform, as the second step, a third step of converting, by the sub-FFTs 131-1 to 131-4, the sampling sequences in the lines from time-domain signals into frequency-domain signals, a fourth step of performing, by the signal processing units 132-1 to 132-4, at one time, phase compensation processing for the sub-Nyquist zones of the sampling sequences converted into the frequency-domain signals, and processing to cancel phase rotation due to delay time differences between the sampling sequences, a fifth step of determining, by the target frequency estimator 133, into which sub-Nyquist zone the target signal has been folded and estimating, by the target frequency estimator 133, the frequency of the target signal, and a sixth step of converting, by the encoding unit 134, a value representing the sub-Nyquist zone and the corresponding amplitude value into compressed data in a specified data format and outputting, by the encoding unit 134, the compressed data.

Here, the processor 91 is, for example, a central processing unit (CPU), a processing unit, an arithmetic unit, a microprocessor, a microcomputer, a digital signal processor (DSP), or the like. The memory 92 corresponds, for example, to nonvolatile or volatile semiconductor memory such as random-access memory (RAM), read-only memory (ROM), flash memory, an erasable programmable ROM (EPROM), or an electrically EPROM (EEPROM) (registered trademark), or a magnetic disk, a flexible disk, an optical disk, a compact disk, a mini disk, a digital versatile disc (DVD), or the like.

Figure 7:
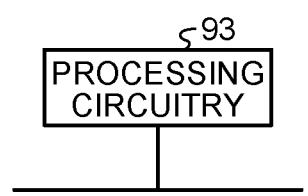
FIG. 7 is a diagram illustrating an example of processing circuitry when the processing circuitry included in the data compression apparatus according to the first embodiment is constituted by dedicated hardware.

FIG. 7 is a diagram illustrating an example of processing circuitry 93 when dedicated hardware constitutes the processing circuitry included in the data compression apparatus 100 according to the first embodiment. The processing circuitry 93 illustrated in FIG. 7 corresponds, for example, to a single circuit, a combined circuit, a programmed processor, a parallel-programmed processor, an application-specific integrated circuit (ASIC), a field-programmable gate array (FPGA), or a combination of them. The processing circuitry may be implemented partly by dedicated hardware and partly by software or firmware. Thus, the processing circuitry can implement the above-described functions by dedicated hardware, software, firmware, or a combination of them.

The hardware configuration of the data compression apparatus 100 has been described. The hardware configuration of the data decompression apparatus 200 is the same as the hardware configuration of the data compression apparatus 100.

As described above, according to the present embodiment, in the data compression apparatus 100, the MCS receiver 120 adds different delay times to different signals obtained by branching a target signal into a plurality of lines, and outputs sampling sequences obtained by sampling the signals at a sampling rate less than the Nyquist rate. The MCS encoder 130 converts the sampling sequences in the lines from time-domain signals into frequency-domain signals, and performs, at one time, phase compensation processing for the sub-Nyquist zones of the sampling sequences converted into the frequency-domain signals, and processing to cancel phase rotation due to delay time differences between the sampling sequences. The MCS encoder 130 determines into which sub-Nyquist zone the target signal has been folded, estimates the frequency of the target signal, converts a value representing the sub-Nyquist zone and the corresponding amplitude value into compressed data in a specified data format, and outputs the compressed data. Consequently, when outputting a target signal to the data decompression apparatus 200, the data compression apparatus 100 can improve the compression ratio of a sparse signal while reducing an increase in computational load.

Second Embodiment

A second embodiment describes a case where a data compression apparatus applies Hann windows to time-series data, that is, output signals sub-Nyquist sampled by the sub-ADCs 123-1 to 123-4.

Figure 8:
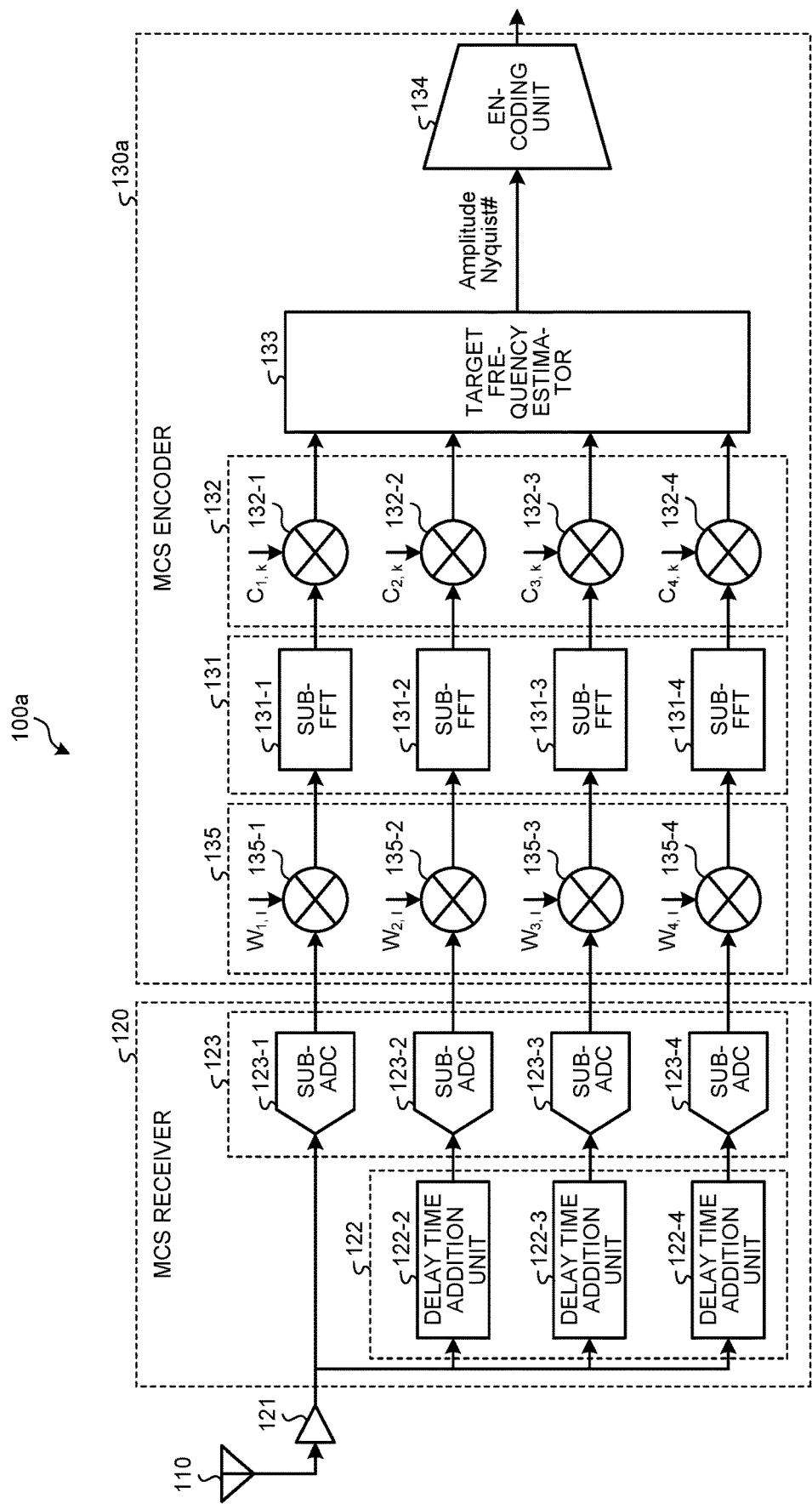
FIG. 8 is a diagram illustrating a configuration example of a data compression apparatus according to a second embodiment.
Figure 9:
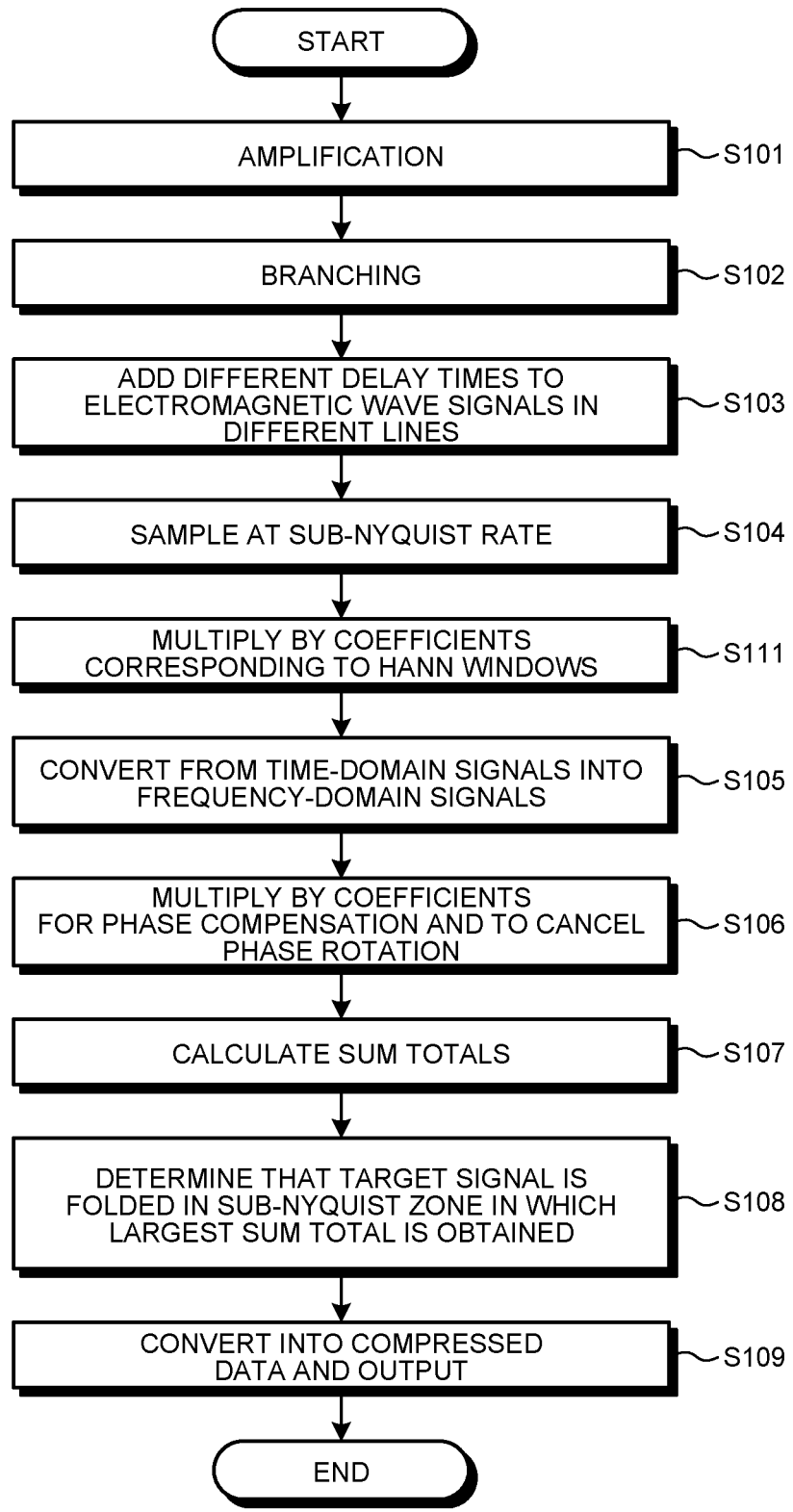
FIG. 9 is a flowchart illustrating the operation of the data compression apparatus according to the second embodiment.

FIG. 8 is a diagram illustrating a configuration example of a data compression apparatus 100a according to the second embodiment. FIG. 9 is a flowchart illustrating the operation of the data compression apparatus 100a according to the second embodiment. The data compression apparatus 100a includes the MCS receiver 120 and an MCS encoder 130a. The MCS encoder 130a is obtained by adding window processing units 135-1 to 135-4 to the MCS encoder 130 of the first embodiment illustrated in FIG. 2.

In the data compression apparatus 100a, the operation up to step S104 is the same as the operation of the data compression apparatus 100 in the first embodiment. After the operation in step S104, in the MCS encoder 130a, the window processing units 135-1 to 135-4 multiply the sampling sequences sub-Nyquist sampled by the corresponding sub-ADCs 123-1 to 123-4 by coefficients corresponding to the Hann windows (step S111). As illustrated in FIG. 8, the coefficients are $W_{1,1}$ by which the window processing unit 135-1 multiplies the sampling sequence from the sub-ADC 123-1, $W_{2,1}$ by which the window processing unit 135-2 multiplies the sampling sequence from the sub-ADC 123-2, $W_{3,1}$ by which the window processing unit 135-3 multiplies the sampling sequence from the sub-ADC 123-3, and $W_{4,1}$ by which the window processing unit 135-4 multiplies the sampling sequence from the sub-ADC 123-4. Let l=1, 2, . . . , K.

The window processing units 135-1 to 135-4 are collectively referred to as a window processing unit 135. The window processing unit 135 multiplies sampling sequences in the lines output from the MCS receiver 120 by coefficients corresponding to the Hann windows. The window processing unit 135 outputs the sampling sequences in the lines multiplied by the coefficients corresponding to the Hann windows to the sub-FFT 131.

The sub-FFTs 131-1 to 131-4 convert the sampling sequences multiplied by the coefficients corresponding to the Hann windows by the corresponding window processing units 135-1 to 135-4, that is, the sampling sequences in the lines output from the window processing unit 135 from time-domain signals into frequency-domain signals (step S105). That is, the sub-FFTs 131-1 to 131-4 perform processing to convert the sampling sequences output from the corresponding window processing units 135-1 to 135-4 into signals folded in the frequency domain. In the data compression apparatus 100a, the operation in after step S106 is the same as the operation of the data compression apparatus 100 in the first embodiment.

Figure 10:
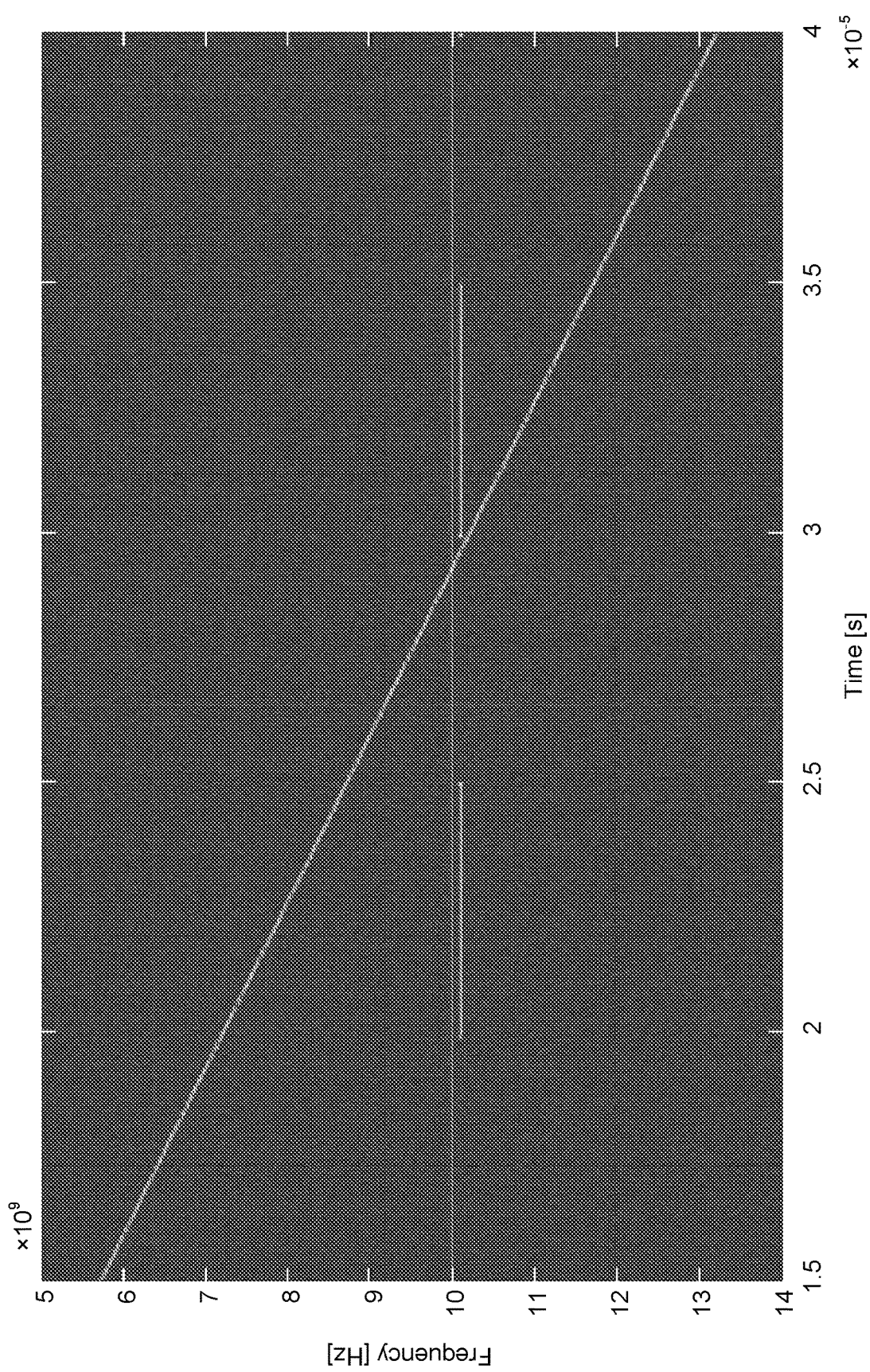
FIG. 10 is a diagram illustrating an example of a spectrogram as a comparative example.

FIG. 10 is a diagram illustrating an example of a spectrogram as a comparative example. In FIG. 10, the horizontal axis represents time, the vertical axis represents frequency, and differences in shades of color in the graph represent amplitude absolute values. The spectrogram illustrated in FIG. 10 is obtained when a data compression apparatus of the comparative example receives a signal on which a continuous wave (CW) signal, a pulse signal, and a chirp signal are superimposed, performs sampling at a sampling rate equal to the Nyquist rate, and performs signal processing by an FFT.

Figure 11:
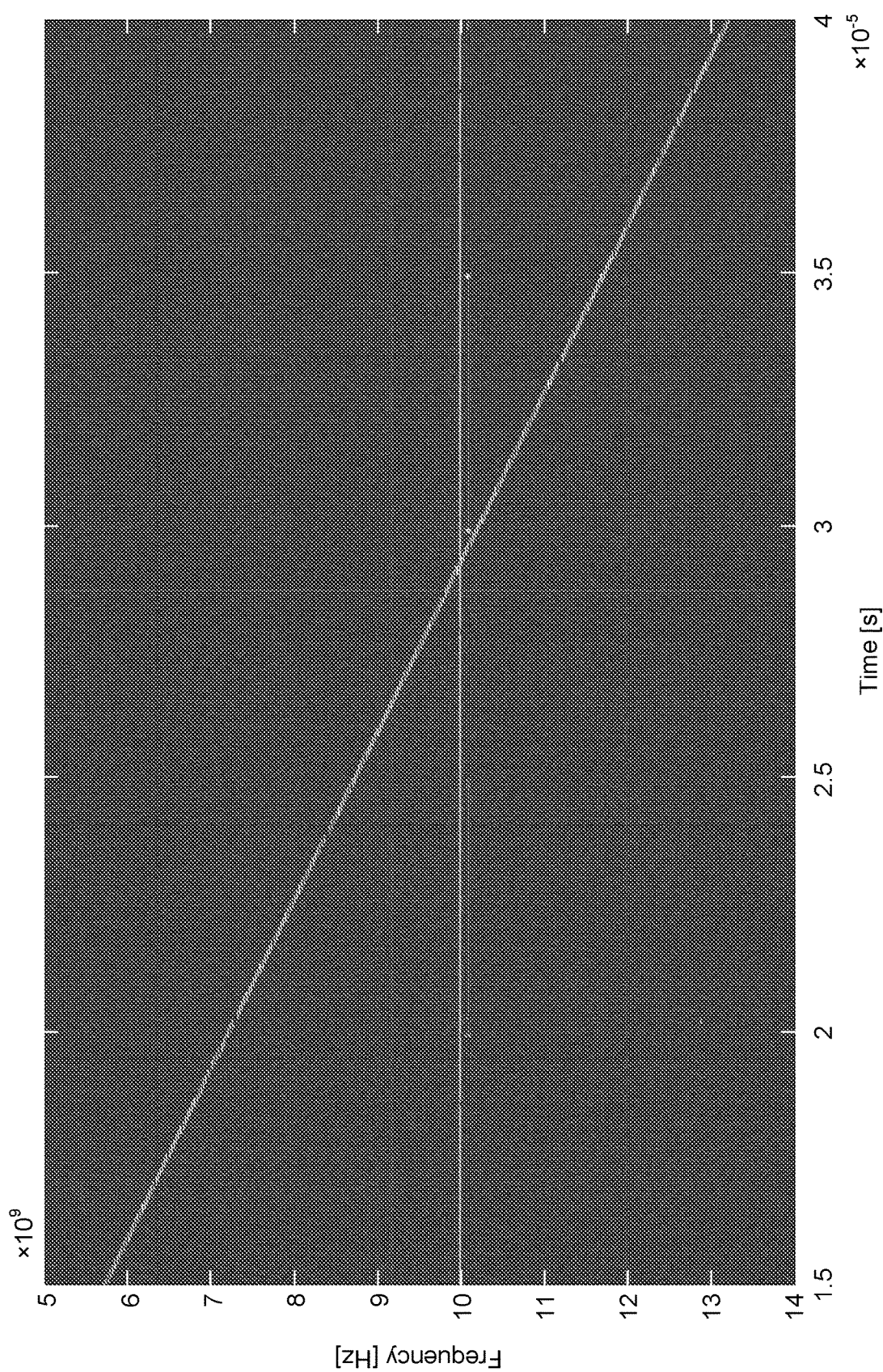
FIG. 11 is a diagram illustrating an example of a spectrogram obtained through encoding and decoding by a data compression system consisting of the data compression apparatus illustrated in FIG. 8 and the data decompression apparatus illustrated in FIG. 4.

FIG. 11 is a diagram illustrating an example of a spectrogram obtained through encoding and decoding by a data compression system consisting of the data compression apparatus 100a illustrated in FIG. 8 and the data decompression apparatus 200 illustrated in FIG. 4. In FIG. 11, the horizontal axis represents time, the vertical axis represents frequency, and differences in shades of color in the graph represent amplitude absolute values. A comparison between FIG. 10 and FIG. 11 shows that the spectrogram obtained by the data compression system consisting of the data compression apparatus 100a illustrated in FIG. 8 and the data decompression apparatus 200 illustrated in FIG. 4 has a high degree of coincidence with the spectrogram of the comparative example obtained when sampling is performed at the sampling rate equal to the Nyquist rate and signal processing is performed by the FFT.

As for the hardware configuration of the data compression apparatus 100a, the MCS receiver 120 and the MCS encoder 130a are implemented by processing circuitry. The processing circuitry may be a processor that executes a program stored in memory and the memory, or may be dedicated hardware.

As described above, according to the present embodiment, in the data compression apparatus 100a, the MCS encoder 130a performs window processing on sampling sequences. Consequently, compared with the first embodiment, the data compression apparatus 100a reduces side lobes in a spectrogram to be compressed and increases sparsity, and thus can compress data more effectively.

Third Embodiment

In a third embodiment, the MCS encoder 130 of the data compression apparatus 100 in the first embodiment performs processing only on sub-Nyquist zones in which a valid signal can be present.

The data compression apparatus 100 uses a target signal that is an electromagnetic wave signal received by the antenna 110 and amplified by the amplifier 121. However, the fractional bandwidth of the antenna 110 is, for example, only about 0.5, and a valid signal can be present in limited sub-Nyquist zones of the K sub-Nyquist zones. Therefore, the MCS encoder 130 can perform the signal processing on limited sub-Nyquist zones, according to the characteristics of the antenna 110.

As described above, according to the present embodiment, in the data compression apparatus 100, the MCS encoder 130 performs the signal processing only on sub-Nyquist zones of the K sub-Nyquist zones in which a valid signal can be present. Consequently, the data compression apparatus 100 can reduce the processing load of the signal processing.

Fourth Embodiment

In a fourth embodiment, the MCS encoder 130a of the data compression apparatus 100a in the second embodiment performs the signal processing only on sub-Nyquist zones in which a valid signal can be present.

The data compression apparatus 100a uses a target signal that is an electromagnetic wave signal received by the antenna 110 and amplified by the amplifier 121. However, the fractional bandwidth of the antenna 110 is, for example, only about 0.5, and a valid signal can be present in limited sub-Nyquist zones of the K sub-Nyquist zones. Therefore, the MCS encoder 130a can perform the signal processing on limited sub-Nyquist zones, according to the characteristics of the antenna 110.

As described above, according to the present embodiment, in the data compression apparatus 100a, the MCS encoder 130a performs the signal processing only on sub-Nyquist zones of the K sub-Nyquist zones in which a valid signal can be present. Consequently, the data compression apparatus 100a can reduce the processing load of the signal processing.

Fifth Embodiment

In the first to fourth embodiments, the MCS receiver 120 samples a target signal branched with the sub-ADCs 123-1 to 123-4. In a fifth embodiment, an MCS receiver samples a target signal by one ADC before branching the target signal.

Figure 12:
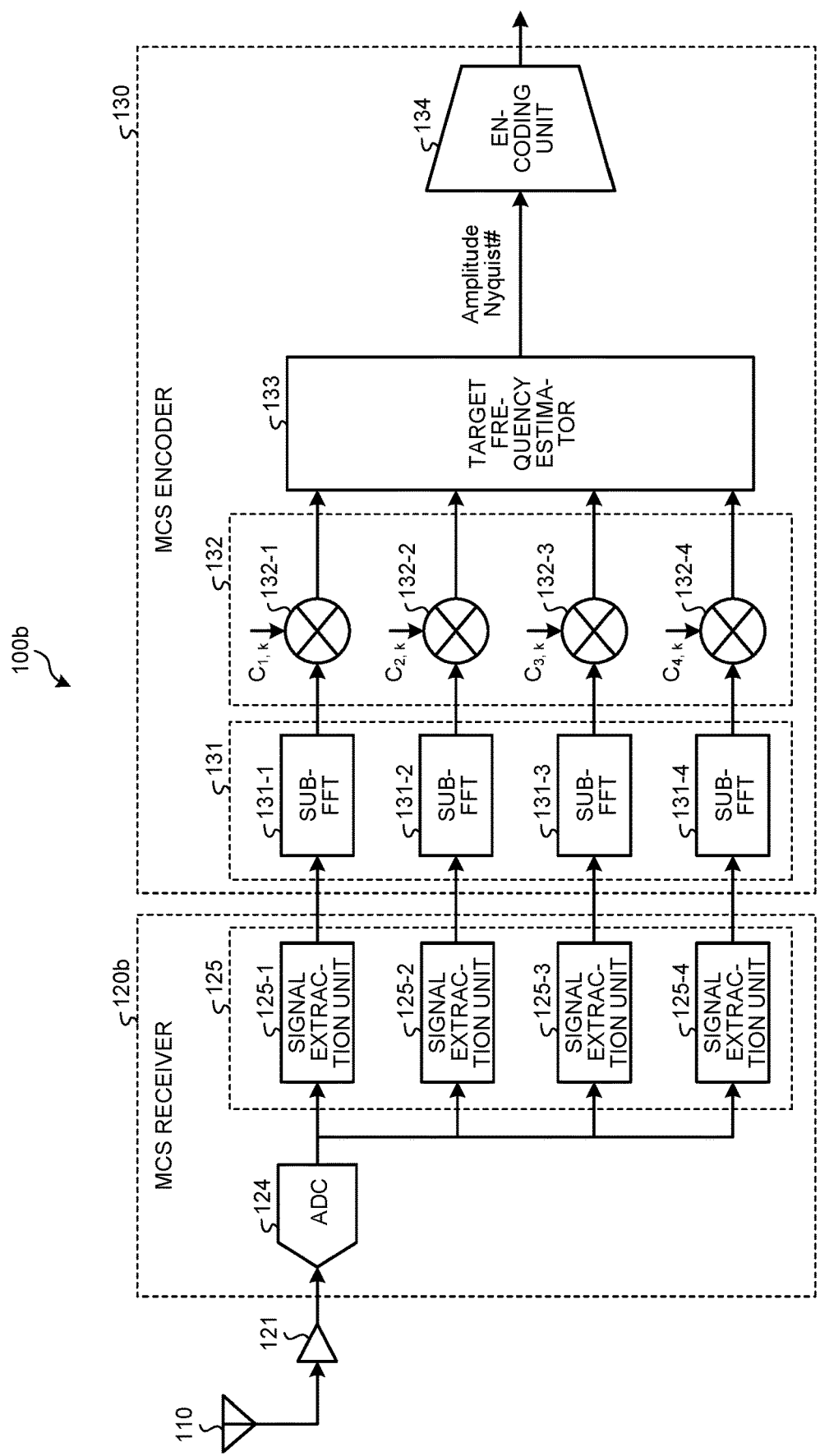
FIG. 12 is a diagram illustrating a configuration example of a data compression apparatus according to a fifth embodiment.
Figure 13:
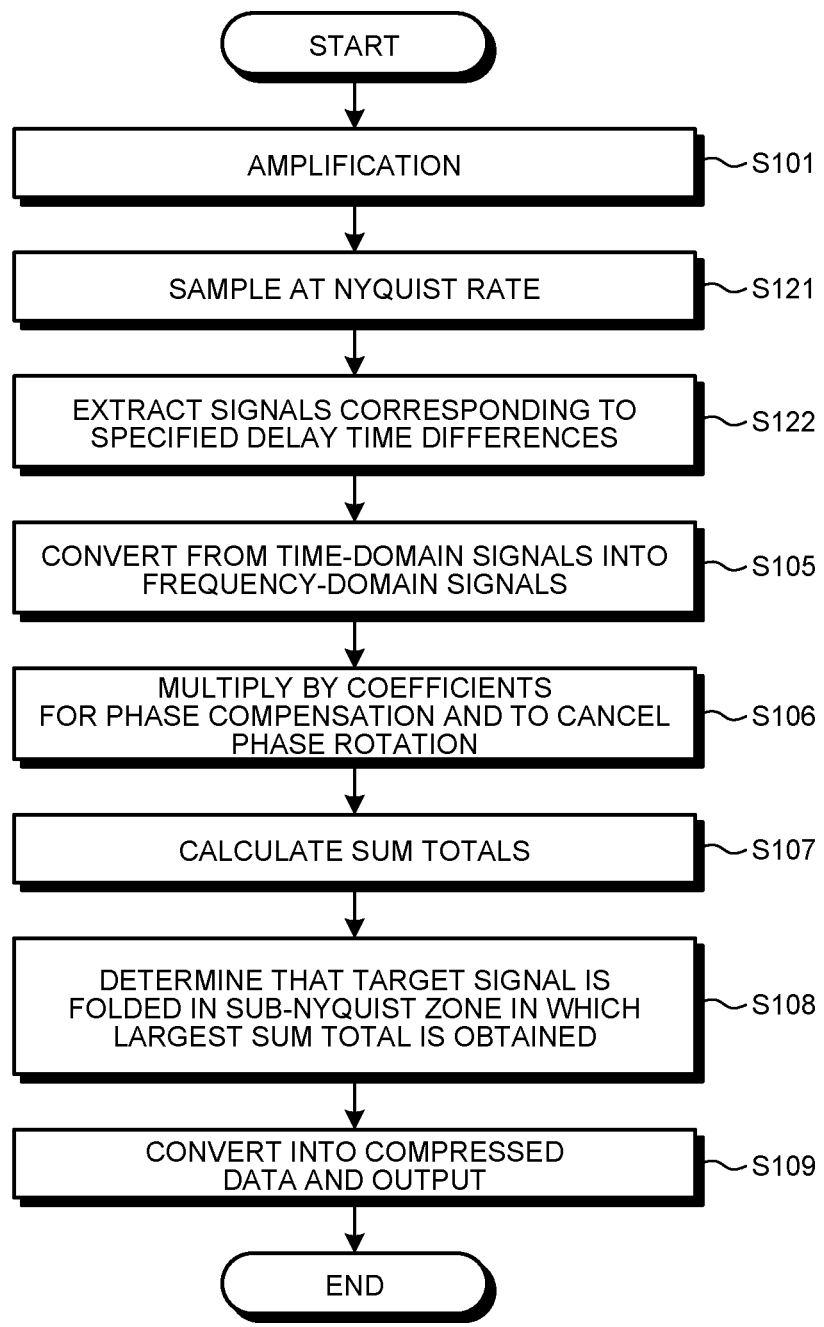
FIG. 13 is a flowchart illustrating the operation of the data compression apparatus according to the fifth embodiment.

FIG. 12 is a diagram illustrating a configuration example of a data compression apparatus 100b according to the fifth embodiment. FIG. 13 is a flowchart illustrating the operation of the data compression apparatus 100b according to the fifth embodiment. The data compression apparatus 100b includes an MCS receiver 120b and the MCS encoder 130.

The MCS receiver 120b is a receiver that converts a target signal that is an electromagnetic wave signal received by the antenna 110 and amplified by the amplifier 121 into a plurality of sampling sequences. The MCS receiver 120b includes the amplifier 121, an ADC 124 as a sampling unit, and signal extraction units 125-1 to 125-4.

In the preceding stage of the data compression apparatus 100b, the amplifier 121 amplifies a target signal that is an electromagnetic wave signal received by the antenna 110 (step S101). In the data compression apparatus 100b, the ADC 124 of the MCS receiver 120b samples the target signal amplified by the amplifier 121 at a sampling rate of the Nyquist rate (step S121). The signal extraction units 125-1 to 125-4 each extract a signal corresponding to a specified delay time difference from the signal sampled by the ADC 124 to give the delay time difference to the sampling timing of the ADC 124 (step S122). The signal extraction units 125-1 to 125-4 are collectively referred to as a signal extraction unit 125. The operation of the MCS encoder 130 after that is the same as the operation of the MCS encoder 130 in the first embodiment. The data compression apparatus 100b may replace the MCS encoder 130 with the MCS encoder 130a of the second embodiment.

As for the hardware configuration of the data compression apparatus 100b, the MCS receiver 120b and the MCS encoder 130 are implemented by processing circuitry. The processing circuitry may be a processor that executes a program stored in memory and the memory, or may be dedicated hardware.

As described above, according to the present embodiment, in the data compression apparatus 100b, the MCS receiver 120b extracts signals corresponding to the specified delay time differences after sampling a target signal. Also in this case, the data compression apparatus 100b can obtain the same effects as the data compression apparatus 100 in the first embodiment.

Sixth Embodiment

In the first to fifth embodiments, the target frequency estimator 133 takes the sum totals of values obtained by multiplication by the corresponding coefficients in the signal processing units 132-1 to 132-4, and determines that the signal is folded in a sub-Nyquist zone in which the largest sum total is obtained. A sixth embodiment describes a method by which the target frequency estimator 133 determines a sub-Nyquist zone in which a signal is folded by another method. The description uses the first embodiment as an example, but the method is also applicable to the second to fifth embodiments.

Figure 14:
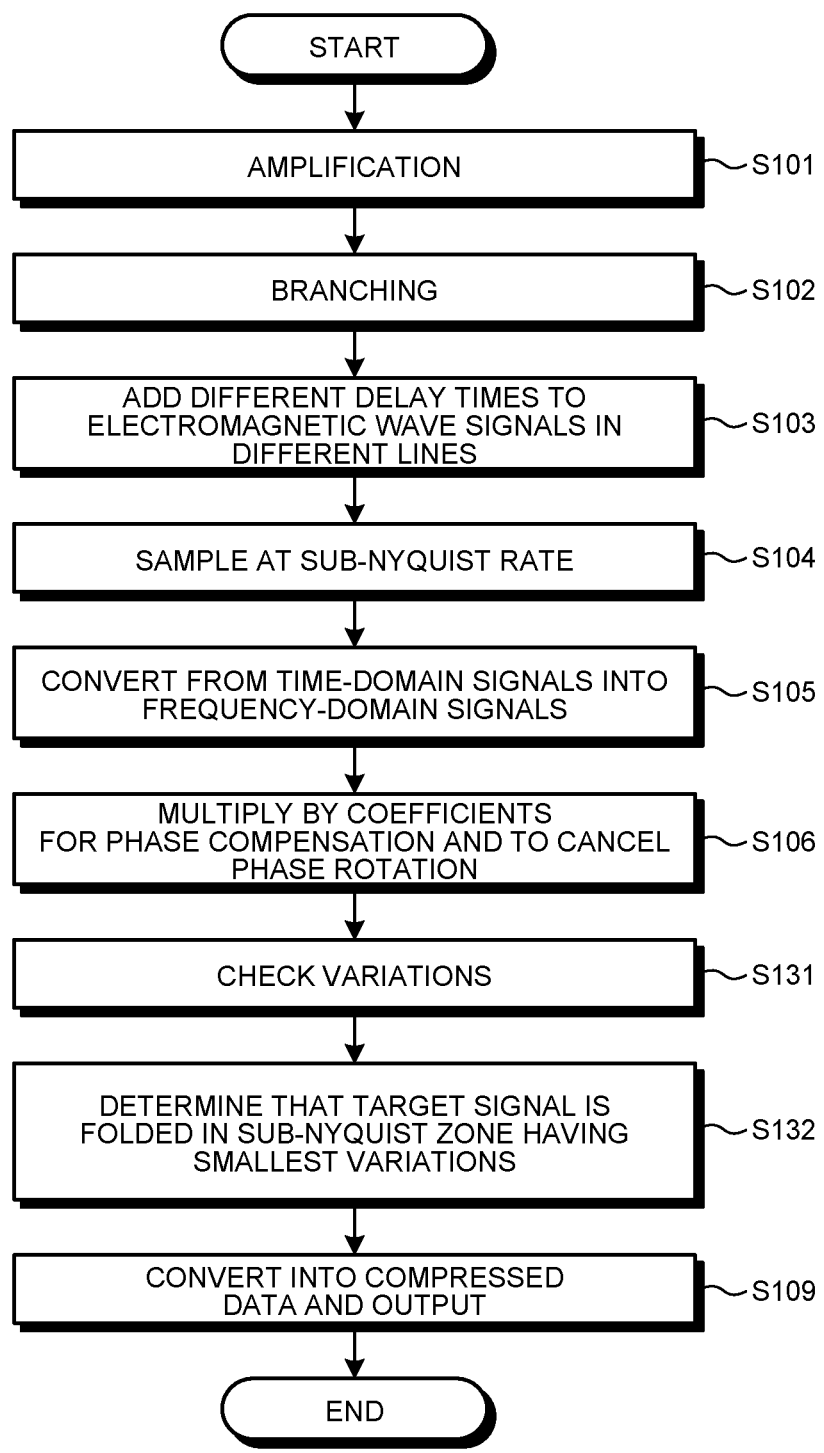
FIG. 14 is a flowchart illustrating the operation of a data compression apparatus according to a sixth embodiment.

FIG. 14 is a flowchart illustrating the operation of the data compression apparatus 100 according to the sixth embodiment. In the flowchart illustrated in FIG. 14, the operation from step S101 to step S106 and the operation in step S109 are the same as the operation from step S101 to step S106 and the operation in step S109 in the flowchart in the first embodiment illustrated in FIG. 3. The target frequency estimator 133 checks variations in values obtained by multiplication by the coefficients $C_{1,k}$, $C_{2,k}$, $C_{3,k}$, and $C_{4,k}$ for each sub-Nyquist zone, that is, for each identical sub-Nyquist zone number k in the signal processing units 132-1 to 132-4 (step S131). The target frequency estimator 133 determines a sub-Nyquist zone in which the target signal is folded. Specifically, the target frequency estimator 133 determines that the target signal is folded in a sub-Nyquist zone having the smallest variations (step S132).

As described above, according to the present embodiment, in the data compression apparatus 100, the MCS encoder 130 determines that a target signal is folded in a sub-Nyquist zone having the smallest variations in values obtained by multiplication by the coefficients for each sub-Nyquist zone. Also in this case, the data compression apparatus 100 can obtain the same effects as the data compression apparatus 100 of the first embodiment.

Seventh Embodiment

A seventh embodiment describes a case where a data compression apparatus performs encoding processing in two stages in a data compression system. The description uses the first embodiment as an example, but the case is also applicable to the second to sixth embodiments.

Figure 15:
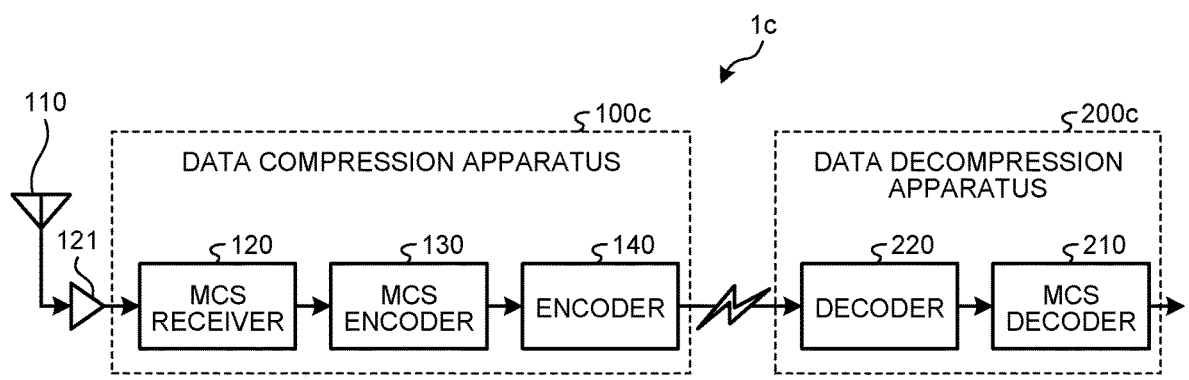
FIG. 15 is a diagram illustrating a configuration example of a data compression system according to a seventh embodiment.

FIG. 15 is a diagram illustrating a configuration example of a data compression system 1c according to the seventh embodiment. The data compression system 1c includes a data compression apparatus 100c and a data decompression apparatus 200c. The data compression apparatus 100c is obtained by adding an encoder 140 to the data compression apparatus 100. The data decompression apparatus 200c is obtained by adding a decoder 220 to the data decompression apparatus 200.

In the data compression apparatus 100c, the encoder 140 further compresses compressed data output from the encoding unit 134 and outputs the further compressed data to the data decompression apparatus 200c. The encoder 140 may use, for example, entropy coding such as a Huffman code or an arithmetic code, or may use logarithmic transformation, floating-point return, or the like, or may use a combination of them. In the following description, the MCS encoder 130 is sometimes referred to as a first encoder, and the encoder 140 is sometimes referred to as a second encoder.

In the data decompression apparatus 200c, the decoder 220 decodes the compressed data acquired from the data compression apparatus 100c using a decoding scheme corresponding to an encoding scheme of the encoder 140, and outputs the decoded data to the MCS decoder 210. In the following description, the MCS decoder 210 is sometimes referred to as a first decoder, and the decoder 220 is sometimes referred to as a second decoder.

As for the hardware configuration of the data compression apparatus 100c, the MCS receiver 120, the MCS encoder 130, and the encoder 140 are implemented by processing circuitry. The processing circuitry may be a processor that executes a program stored in memory and the memory, or may be dedicated hardware. Likewise, as for the hardware configuration of the data decompression apparatus 200c, the MCS decoder 210 and the decoder 220 are implemented by processing circuitry. The processing circuitry may be a processor that executes a program stored in memory and the memory, or may be dedicated hardware.

As described above, according to the present embodiment, the data compression apparatus 100c includes the encoder 140 to further compress compressed data, and the data decompression apparatus 200c includes the decoder 220 to decode the compressed data compressed, that is, encoded by the encoder 140. Consequently, the data compression apparatus 100c can output compressed data compressed further than in the data compression apparatus 100 of the first embodiment.

Eighth Embodiment

An eighth embodiment describes a case where a data decompression apparatus includes a storage in a data compression system. The description uses the first embodiment as an example, but the case is also applicable to the second to sixth embodiments.

Figure 16:
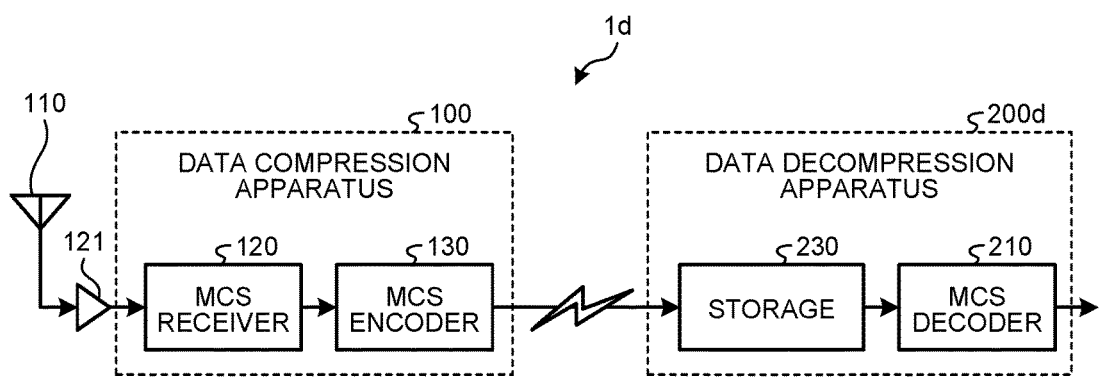
FIG. 16 is a diagram illustrating a configuration example of a data compression system according to an eighth embodiment.

FIG. 16 is a diagram illustrating a configuration example of a data compression system 1d according to the eighth embodiment. The data compression system 1d includes the data compression apparatus 100 and a data decompression apparatus 200d. The data decompression apparatus 200d is obtained by adding a storage 230 to the data decompression apparatus 200.

In the data decompression apparatus 200d, the storage 230 stores compressed data acquired from the data compression apparatus 100. Using the compressed data stored in the storage 230, the MCS decoder 210 restores an amplitude value corresponding to a frequency before being folded in the data compression apparatus 100. In the example of FIG. 16, an example in which the data decompression apparatus 200d includes the storage 230 has been described, but the data compression apparatus 100 may also include a storage in the subsequent stage of the MCS encoder 130.

As for the hardware configuration of the data decompression apparatus 200d, the MCS decoder 210 and the storage 230 are implemented by processing circuitry. The processing circuitry may be a processor that executes a program stored in memory and the memory, or may be dedicated hardware.

As described above, according to the present embodiment, the data decompression apparatus 200d stores compressed data acquired from the data compression apparatus 100 in the storage 230 and then performs decoding. For example, if the state of communication between the data compression apparatus 100 and the data decompression apparatus 200d deteriorates, and it takes time to acquire compressed data from the data compression apparatus 100, the data decompression apparatus 200d can store compressed data in the storage 230 to store a required amount of compressed data, and then perform decoding.

Ninth Embodiment

A ninth embodiment describes a case where the storage 230 is added to the data decompression apparatus 200c of the data compression system 1c in the seventh embodiment.

Figure 17:
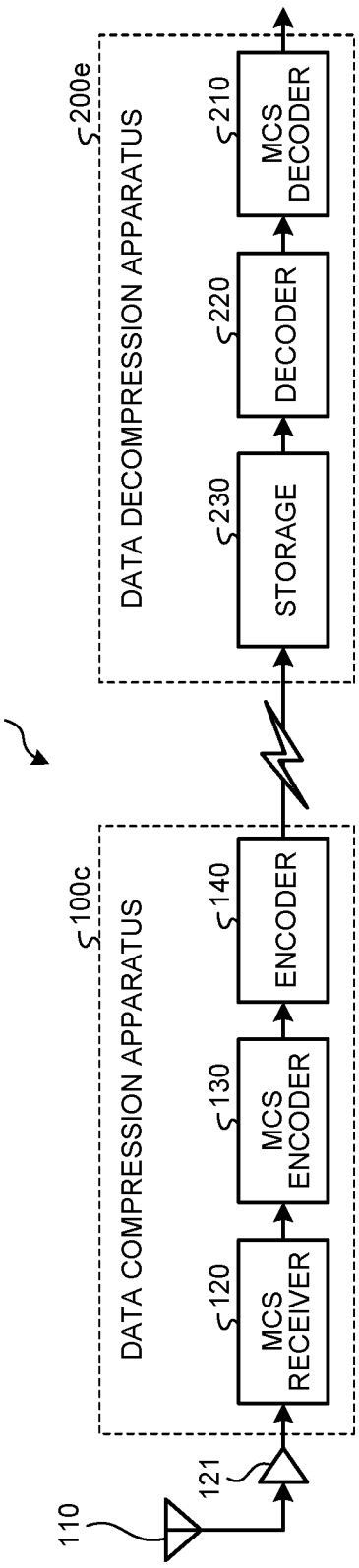
FIG. 17 is a diagram illustrating a configuration example of a data compression system according to a ninth embodiment.

FIG. 17 is a diagram illustrating a configuration example of a data compression system 1e according to the ninth embodiment. The data compression system 1e includes the data compression apparatus 100c and a data decompression apparatus 200e. The data decompression apparatus 200e is obtained by adding the storage 230 to the data decompression apparatus 200c.

In the data decompression apparatus 200e, the storage 230 stores compressed data acquired from the data compression apparatus 100c. The decoder 220 decodes the compressed data stored in the storage 230 using a decoding scheme corresponding to an encoding scheme of the encoder 140, and outputs the decoded data to the MCS decoder 210. In the example of FIG. 17, an example in which the data decompression apparatus 200e includes the storage 230 has been described, but the data compression apparatus 100c may also include a storage in the subsequent stage of the encoder 140.

As for the hardware configuration of the data decompression apparatus 200e, the MCS decoder 210, the decoder 220, and the storage 230 are implemented by processing circuitry. The processing circuitry may be a processor that executes a program stored in memory and the memory, or may be dedicated hardware.

As described above, according to the present embodiment, the data decompression apparatus 200e stores compressed data acquired from the data compression apparatus 100c in the storage 230 and then performs decoding. Also in this case, the data decompression apparatus 200e can obtain the same effects as the data decompression apparatus 200d of the eighth embodiment.

Tenth Embodiment

A tenth embodiment describes a case where a data decompression apparatus includes an inverse discrete Fourier transform (IDFT). The description uses the first embodiment as an example, but the case is also applicable to the second to ninth embodiments.

Figure 18:
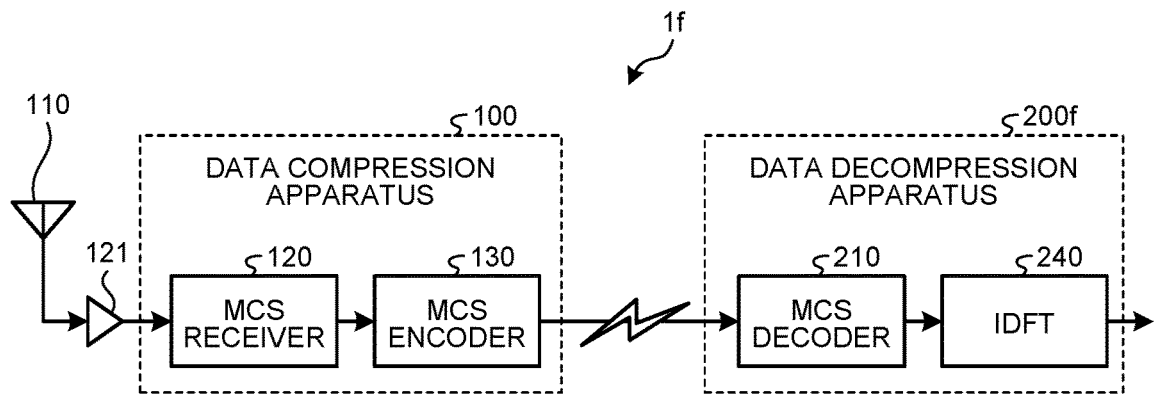
FIG. 18 is a diagram illustrating a configuration example of a data compression system according to a tenth embodiment.

FIG. 18 is a diagram illustrating a configuration example of a data compression system if according to the tenth embodiment. The data compression system if includes the data compression apparatus 100 and a data decompression apparatus 200f. The data decompression apparatus 200f is obtained by adding an IDFT 240 to the data decompression apparatus 200.

In the data decompression apparatus 200f, the IDFT 240 is a frequency-time transform unit that converts a value restored by the MCS decoder 210, that is, a frequency amplitude value from a frequency-domain signal into a time-domain signal and outputs the time-domain signal.

As for the hardware configuration of the data decompression apparatus 200f, the MCS decoder 210 and the IDFT 240 are implemented by processing circuitry. The processing circuitry may be a processor that executes a program stored in memory and the memory, or may be dedicated hardware.

As described above, according to the present embodiment, the data decompression apparatus 200f converts a restored frequency amplitude value from a frequency-domain signal into a time-domain signal and outputs the time-domain signal. Consequently, the data decompression apparatus 200f can output, to an apparatus in the subsequent stage (not illustrated), decoded information in a time-domain signal form similar to that of the target signal acquired by the data compression apparatus 100.

Eleventh Embodiment

An eleventh embodiment describes a case where a data compression apparatus includes a plurality of antennas. The description uses the first embodiment as an example, but the case is also applicable to the second to tenth embodiments.

Figure 19:
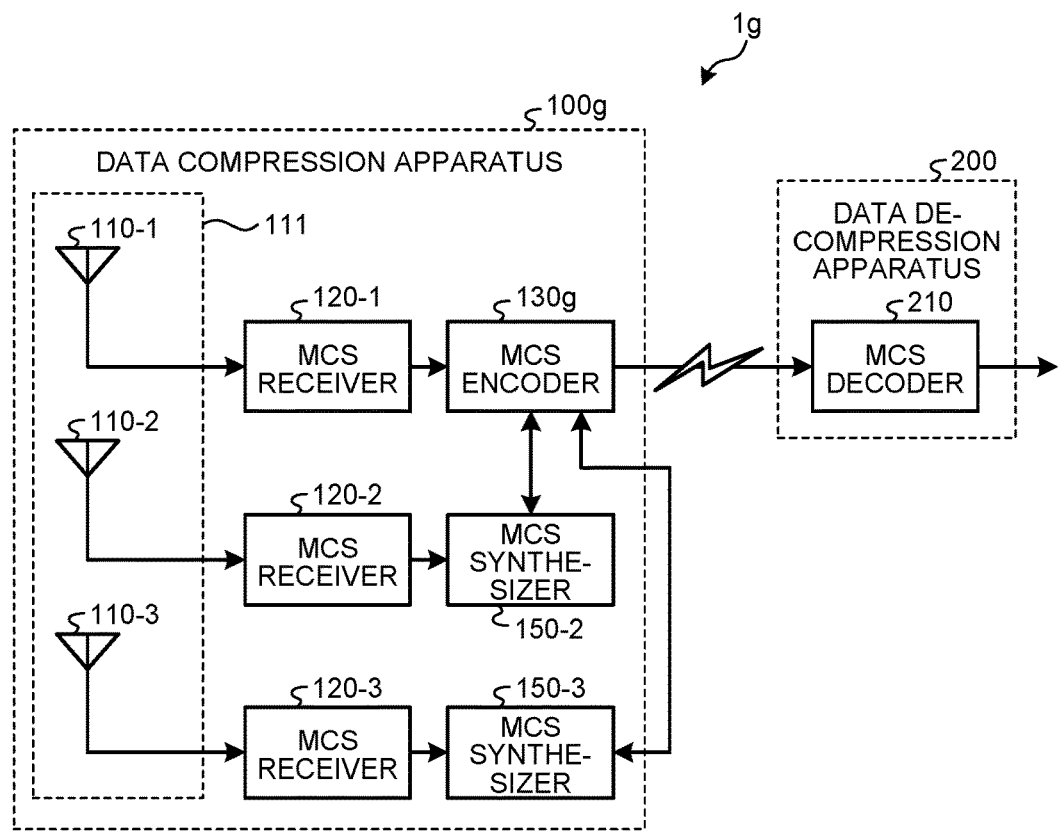
FIG. 19 is a diagram illustrating a configuration example of a data compression system according to an eleventh embodiment.

FIG. 19 is a diagram illustrating a configuration example of a data compression system 1g according to the eleventh embodiment. The data compression system 1g includes a data compression apparatus 100g and the data decompression apparatus 200. The data compression apparatus 100g includes an array antenna element group 111 consisting of a primary antenna 110-1 and one or more secondary antennas 110-2 and 110-3, a primary MCS receiver 120-1, one or more secondary MCS receivers 120-2 and 120-3, an MCS encoder 130g, and one or more MCS synthesizers 150-2 and 150-3. The primary MCS receiver 120-1 is connected to the primary antenna 110-1, the secondary MCS receiver 120-2 is connected to the secondary antenna 110-2, and the secondary MCS receiver 120-3 is connected to the secondary antenna 110-3 to 110-3 have the same configuration as the above-described antenna 110. The MCS receivers 120-1 to 120-3 have the same configuration as the above-described MCS receiver 120.

In the following description, the antennas 110-1 to 110-3 are sometimes referred to as antennas 110 when not distinguished, and the MCS receivers 120-1 to 120-3 are sometimes referred to as MCS receivers 120 when not distinguished. The data compression apparatus 100g includes a plurality of MCS receivers 120, and each of the plurality of MCS receivers 120 is connected to a different antenna 110. The MCS receiver 120-1 is sometimes referred to as a first receiver, and the MCS receivers 120-2 and 120-3 are sometimes referred to as second receivers. In the present embodiment, the MCS receiver 120-1, a first receiver of the plurality of MCS receivers 120, outputs sampling sequences of a target signal received by the primary antenna 110-1. The MCS receivers 120-2 and 120-3, one or more second receivers of the plurality of MCS receivers 120, output sampling sequences of the target signal received by the secondary antennas 110-2 and 110-3.

Figure 20:
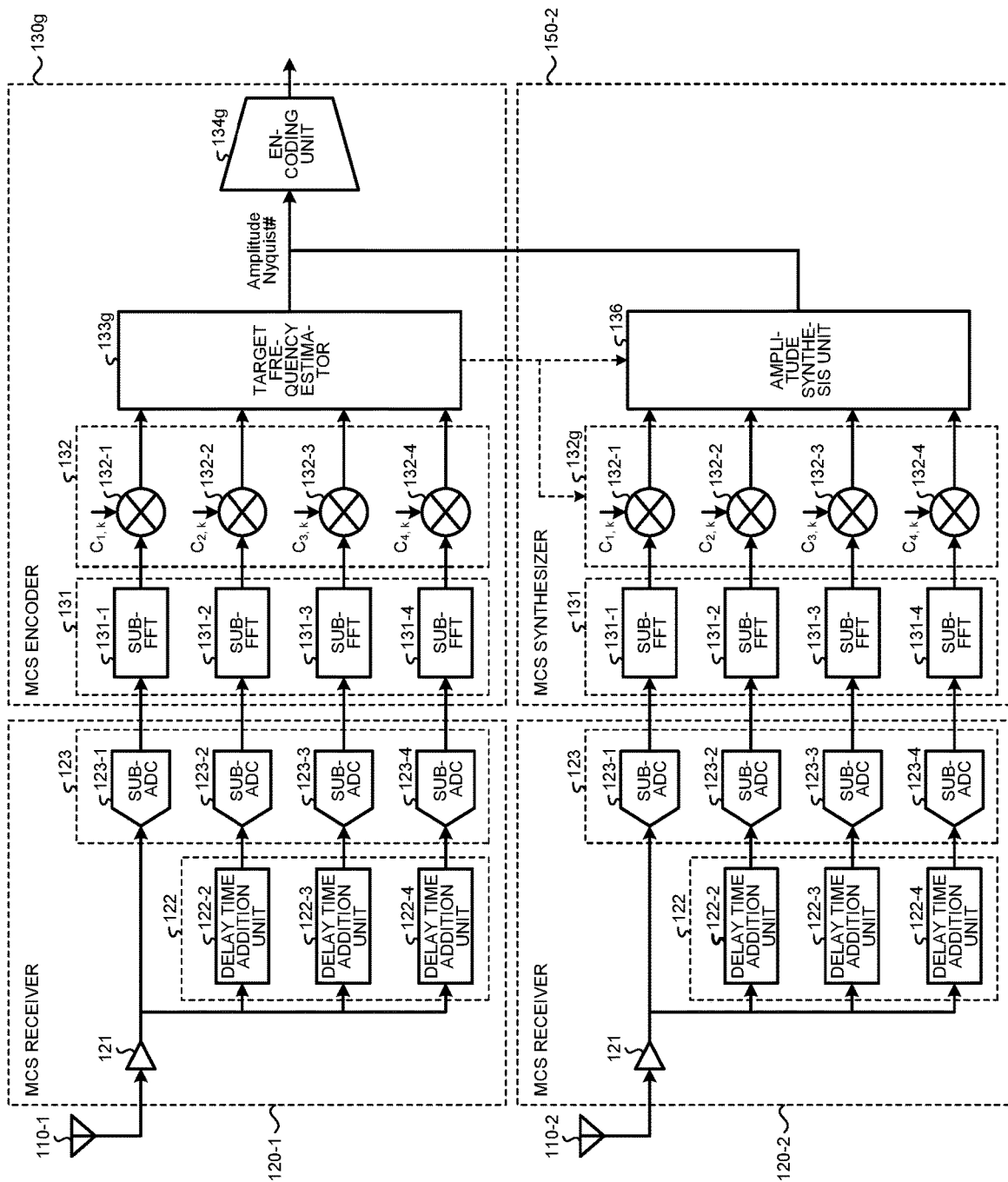
FIG. 20 is a diagram illustrating a configuration example of a data compression apparatus according to the eleventh embodiment.

FIG. 20 is a diagram illustrating a configuration example of the data compression apparatus 100g according to the eleventh embodiment. Here, for ease of explanation, a case where the data compression apparatus 100g includes one secondary antenna 110-2, one secondary MCS receiver 120-2, and one MCS synthesizer 150-2 will be described.

Like the MCS receiver 120 of the first embodiment etc., the MCS receiver 120-1 performs sub-Nyquist sampling on an electromagnetic wave signal received by the antenna 110-1 in a plurality of sequences in parallel. The MCS encoder 130g includes the sub-FFT 131, the signal processing unit 132, a target frequency estimator 133g, and an encoding unit 134g. As in the MCS encoder 130 of the first embodiment, in the MCS encoder 130g, the sub-FFT 131 converts the sub-Nyquist-sampled sampling sequences into signals folded in the frequency domain, and the signal processing unit 132 performs phase compensation for each sub-Nyquist zone. In the present embodiment, the target frequency estimator 133g calculates the sum totals of amplitude components each phase-compensated by the signal processing unit 132, and searches for a sub-Nyquist zone corresponding to one of the sum totals whose absolute value is the largest value. The target frequency estimator 133g outputs, to the encoding unit 134g, the value of the sum total of the amplitude components corresponding to the one whose absolute value is the largest value, and sub-Nyquist zone information that is the value of the sub-Nyquist zone corresponding to the one whose absolute value is the largest value. The target frequency estimator 133g outputs the sub-Nyquist zone information to the MCS synthesizer 150-2.

Like the MCS receiver 120 of the first embodiment etc., the MCS receiver 120-2 performs sub-Nyquist sampling on an electromagnetic wave signal received by the antenna 110-2 in a plurality of sequences in parallel. The MCS synthesizer 150-2 includes the sub-FFT 131, a signal processing unit 132g, and an amplitude synthesis unit 136. As in the MCS encoder 130 of the first embodiment etc., in the MCS synthesizer 150-2, the sub-FFT 131 converts the sub-Nyquist-sampled sampling sequences into signals folded in the frequency domain. In the present embodiment, the signal processing unit 132g performs phase compensation for a sub-Nyquist zone according to the sub-Nyquist zone information on a primary element line that is a line of the primary antenna 110-1 acquired from the target frequency estimator 133g of the MCS encoder 130g. The amplitude synthesis unit 136 calculates the sum total of amplitude components phase-compensated by the signal processing unit 132g, according to the sub-Nyquist zone information on the primary element line acquired from the target frequency estimator 133g of the MCS encoder 130g, and outputs the value of the sum total of the amplitude components to the MCS encoder 130g.

Thus, the MCS synthesizer 150-2 is a synthesizer that is connected to a different second receiver, calculates the sum total of amplitude components corresponding to a sub-Nyquist zone, using the sub-Nyquist zone information acquired from the MCS encoder 130g, and outputs the sum total to the MCS encoder 130g. For the secondary antenna 110-2, the MCS synthesizer 150-2, which uses the sub-Nyquist zone information acquired from the target frequency estimator 133g of the MCS encoder 130g, thus only needs to perform phase compensation for a single sub-Nyquist zone, allowing a reduction in the amount of computation to determine the sum total of amplitude components after that, and the elimination of computation to search for the largest value of absolute values. Consequently, the MCS synthesizer 150-2 allows a signal processing circuit to be reduced in size, power consumption, and cost and increased in speed, for example, as compared with the MCS encoder 130g.

Furthermore, the encoding unit 134g of the MCS encoder 130g can share sub-Nyquist zone information on a secondary element line that is a line of the secondary antenna 110-2, the value of the exponent portion of a floating point, etc. with the primary element line, and thus can improve code compression efficiency. The encoding unit 134g, which shares values between the primary element line and the secondary element line, thus has processing details different from those of the above-described encoding unit 134. As described above, the MCS encoder 130g is connected to the MCS receiver 120-1, and outputs the sub-Nyquist zone information on the sampling sequences of the target signal received by the primary antenna 110-1. Using the sum total of the amplitude components acquired from the MCS synthesizer 150-2, the MCS encoder 130g outputs compressed data obtained by compressing the sampling sequences of the target signal received by the primary antenna 110-1 and the secondary antenna 110-2.

Even when there is a plurality of secondary antennas 110-2 and 110-3, the data compression apparatus 100g can obtain the same effects. The shorter the distance between the primary antenna 110-1 and the secondary antennas 110-2 and 110-3, the stronger the correlation between a signal in the primary element line and signals in the secondary element lines, and the better the compression accuracy becomes. For example, if the distance between the primary antenna 110-1 and the secondary antennas 110-2 and 110-3 is about 1000 m or less, the data compression apparatus 100g can obtain favorable characteristics.

For the circuit configuration of the MCS receivers 120-1 to 120-3 that perform sub-Nyquist sampling, for example, a track-and-hold circuit may be used as described above, or sampling data may be thinned out at a sub-Nyquist rate from an ADC at the Nyquist rate. It is only required that sub-Nyquist sampling can be performed in different phases in parallel.

The MCS receivers 120-2 and 120-3 of the secondary element lines and the MCS receiver 120-1 of the primary element line may be equal or different in phase difference or delay time difference in sub-Nyquist sampling, and may be equal or unequal in the number of parallel sub-Nyquist sampling sequences. In either case, the MCS synthesizers 150-2 and 150-3 of the secondary element lines can perform phase compensation for the sub-Nyquist zone in the primary element line and the respective phase differences or delay time differences of the parallel sub-Nyquist sampling sequences in the secondary element lines.

Even when the number of secondary antennas 110-2 and 110-3 is two or more, the data compression apparatus 100g can obtain the same effects by the same processing.

The MCS encoder 130g may output, in addition to the value of a sub-Nyquist zone corresponding to a one whose absolute value takes the largest value, the values of a relatively small number of sub-Nyquist zones corresponding to a one whose absolute value is the largest next to the largest value and a one the largest next to that, that is, ones whose absolute values are the second largest and below. From the MCS encoder 130g, the MCS synthesizers 150-2 and 150-3 of the secondary element lines acquire the values of the relatively small number of sub-Nyquist zones corresponding to the ones whose absolute values are the second largest and below, thereby performing phase compensation for the relatively small number of sub-Nyquist zones. The MCS synthesizers 150-2 and 150-3 of the secondary element lines may calculate the sum totals of amplitude components each phase-compensated, search for a sub-Nyquist zone corresponding to one of the sum totals whose absolute value takes the largest value, and output the value of the sum total of the amplitude components corresponding to the one whose absolute value takes the largest value. Consequently, the data compression apparatus 100g can also balance the amounts of computation, compression accuracy, etc. between the MCS encoder 130g and the MCS synthesizers 150-2 and 150-3.

FIG. 21 is a flowchart illustrating the operation of the data compression apparatus 100g according to the eleventh embodiment. In FIG. 21, the operation from step S101 to step S108 is the same as the operation of the data compression apparatus 100 in the first embodiment. The target frequency estimator 133g outputs sub-Nyquist zone information to the MCS synthesizer 150-2 (step S141). The amplitude synthesis unit 136 calculates the sum total of amplitude components in the secondary element line phase-compensated by the signal processing unit 132g, according to the sub-Nyquist zone information on the primary element line acquired from the target frequency estimator 133g (step S142). The amplitude synthesis unit 136 outputs the value of the sum total of the amplitude components to the encoding unit 134g. Based on the information acquired from the target frequency estimator 133g and the amplitude synthesis unit 136, the encoding unit 134g converts a value representing the sub-Nyquist zone and the corresponding amplitude values into compressed data in a specified data format and outputs the compressed data (step S143).

FIG. 22 is a flowchart illustrating the operation of the data decompression apparatus 200 according to the eleventh embodiment. The decoding unit 211 acquires the compressed data output from the encoding unit 134g of the data compression apparatus 100g, and extracts, from the compressed data, the value representing the sub-Nyquist zone number k and the same number of the corresponding amplitude values as the number of the antennas 110 (step S211). Using the value representing the sub-Nyquist zone number k and the same number of the corresponding amplitude values as the number of the antennas 110 extracted, the decoding unit 211 restores the same number of amplitude values as the number of the antennas 110 corresponding to frequencies before being folded in the data compression apparatus 100 (step S212). The decoding unit 211 inserts zeros as component values into amplitude values corresponding to frequencies not specified by the sub-Nyquist zone number k (step S203). Thus, the decoding unit 211 is different in processing details from the above-described decoding unit 211.

Twelfth Embodiment

The eighth embodiment has described the case where the data decompression apparatus 200*d* includes the storage 230, and the ninth embodiment has described the case where the data decompression apparatus 200*e* includes the storage 230. A data compression apparatus may include a storage as described above.

FIG. 23 is a first diagram illustrating a configuration example of a data compression system 1*h* according to a twelfth embodiment. The data compression system 1*h* includes a data compression apparatus 100*h* and the data decompression apparatus 200. The data compression apparatus 100*h* is obtained by adding a storage 160 to the data compression apparatus 100. The storage 160 stores compressed data output from the MCS encoder 130. Thus, the data compression apparatus 100*h* can also store compressed data converted by the MCS encoder 130 in the storage 160 and then output the compressed data to the data decompression apparatus 200.

FIG. 24 is a second diagram illustrating a configuration example of a data compression system 1*i* according to the twelfth embodiment. The data compression system 1*i* includes the data compression apparatus 100*h* and the data decompression apparatus 200*d*. The data compression system 1*i* may have the configuration in which the data compression apparatus 100*h* includes the storage 160, and the data decompression apparatus 200*d* includes the storage 230.

The data compression apparatus according to the present disclosure has the effect of being able to improve the compression ratio of a sparse signal while reducing an increase in computational load.

The configurations described in the above embodiments illustrate an example and can be combined with another known art. The embodiments can be combined with each other. The configurations can be partly omitted or changed without departing from the gist.

What is claimed is:

1. A data compression apparatus comprising:
a receiver to output sampling sequences corresponding to signals obtained by adding different delay times to different signals obtained by branching a target signal into a plurality of lines, and sampling the signals at a sampling rate-less-than of a Nyquist rate; and
an encoder to convert the sampling sequences into compressed data and output the compressed data,
the encoder including
a time-frequency transform circuitry to convert the sampling sequences in the lines from time-domain signals into frequency-domain signals,
a signal processing circuitry to perform, at one time, phase compensation processing for sub-Nyquist zones of the sampling sequences converted into the frequency-domain signals, and processing to cancel phase rotation due to delay time differences between the sampling sequences,
a target frequency estimator to determine into which sub-Nyquist zone the target signal has been folded and estimate a frequency of the target signal, and
an encoding circuitry to convert a value representing the sub-Nyquist zone and a corresponding amplitude value into the compressed data in a specified data format and output the compressed data, wherein
the receiver includes
a sampling circuitry to sample the target signal at a sampling rate of the Nyquist rate, and
a signal extraction circuitry to extract signals corresponding to specified delay time differences from a signal sampled by the sampling circuitry.

2. The data compression apparatus according to claim 1, wherein
the receiver includes
a delay time addition circuitry to add the different delay times to the different signals obtained by branching the target signal into the plurality of lines, and
a sub-sampling circuitry to sample the signals at the sampling rate less than the Nyquist rate and output the sampling sequences.

3. The data compression apparatus according to claim 2, wherein
the delay time addition circuitry adds the delay times using a delay element or a track-and-hold circuit.

4. The data compression apparatus according to claim 1, wherein
the encoder further includes
a window processing circuitry to multiply the sampling sequences in the lines output from the receiver by coefficients corresponding to Hann windows, and
the time-frequency transform circuitry converts the sampling sequences in the lines output from the window processing circuitry from time-domain signals into frequency-domain signals.

5. The data compression apparatus according to claim 1, wherein
the encoder performs processing only on sub-Nyquist zones in which a valid signal can be present.

6. The data compression apparatus according to claim 1, wherein
the target frequency estimator calculates a sum total of values obtained by multiplication by coefficients for each sub-Nyquist zone in the signal processing circuitry, and determines that the target signal is folded in a sub-Nyquist zone in which the largest sum total is obtained.

7. The data compression apparatus according to claim 1, wherein
the target frequency estimator determines that the target signal is folded in a sub-Nyquist zone having the smallest variations in values obtained by multiplication by coefficients for each sub-Nyquist zone in the signal processing circuitry.

8. The data compression apparatus according to claim 1, wherein
the encoder is a first encoder, and
the data compression apparatus further comprises a second encoder to compress the compressed data output from the first encoder.

9. The data compression apparatus according to claim 1, wherein
the data compression apparatus comprises a plurality of the receivers, each of the plurality of receivers being connected to a different antenna,
a first receiver of the plurality of receivers outputs the sampling sequences of the target signal received by a primary antenna,
one or more second receivers of the plurality of receivers output the sampling sequences of the target signal received by secondary antennas, the data compression apparatus further comprises one or more synthesizers connected to the corresponding second receivers, to calculate a sum total of amplitude components corresponding to a sub-Nyquist zone, using information on the sub-Nyquist zone acquired from the encoder, and output the sum total of the amplitude components to the encoder, and the encoder is connected to the first receiver, outputs the information on the sub-Nyquist zone of the sampling sequences of the target signal received by the primary antenna, and outputs the compressed data obtained by compressing the sampling sequences of the target signal received by the primary antenna and the secondary antennas, using the sum totals of the amplitude components acquired from the synthesizers.

10. A data decompression apparatus comprising
a decoder to extract the value representing the sub-Nyquist zone and the corresponding amplitude value from the compressed data acquired from the data compression apparatus according to claim 1, and restore an amplitude value corresponding to a frequency before the target signal is folded in the data compression apparatus.

11. The data decompression apparatus according to claim 10, wherein
the encoder is a first encoder,
the decoder is a first decoder, and
the data decompression apparatus further comprises a second encoder to compress the compressed data output from the first encoder, and a second decoder to decode the compressed data acquired from the data compression apparatus.

12. The data decompression apparatus according to claim 10, further comprising
a storage to store the compressed data acquired from the data compression apparatus.

13. The data decompression apparatus according to claim 10, further comprising
a frequency-time transform circuitry to convert the value restored by the decoder from a frequency-domain signal into a time-domain signal.

14. A data compression system comprising:
the data compression apparatus according to claim 1; and
a data decompression apparatus including a decoder to extract the value representing the sub-Nyquist zone and the corresponding amplitude value from the compressed data acquired from the data compression apparatus, and restore an amplitude value corresponding to a frequency before the target signal is folded in the data compression apparatus.

15. A control circuit to control a data compression apparatus, the control circuit causing the data compression apparatus to perform:
outputting sampling sequences corresponding to signals obtained by adding different delay times to different signals obtained by branching a target signal into a plurality of lines, and sampling the signals at a sampling rate-less than of a Nyquist rate; and
converting the sampling sequences into compressed data and outputting the compressed data, and
causing the data compression apparatus to perform:
as converting the sampling sequences into compressed data and outputting the compressed data,
converting the sampling sequences in the lines from time-domain signals into frequency-domain signals;
performing, at one time, phase compensation processing for sub-Nyquist zones of the sampling sequences converted into the frequency-domain signals, and processing to cancel phase rotation due to delay time differences between the sampling sequences;
determining into which sub-Nyquist zone the target signal has been folded and estimating a frequency of the target signal; and
converting a value representing the sub-Nyquist zone and a corresponding amplitude value into the compressed data in a specified data format and outputting the compressed data, wherein
the control circuit causes the data compression apparatus to further perform
sampling the target signal at a sampling rate of the Nyquist rate, and
extracting signals corresponding to specified delay time differences from the sampled target signal.

16. A control circuit to control a data decompression apparatus, the control circuit causing the data decompression apparatus to perform
extracting the value representing the sub-Nyquist zone and the corresponding amplitude value from the compressed data acquired from the data compression apparatus according to claim 1, and restoring an amplitude value corresponding to a frequency before the target signal is folded in the data compression apparatus.

17. A non-transitory computer-readable storage medium storing a program to control a data compression apparatus,
the program causing the data compression apparatus to perform:
outputting sampling sequences corresponding to signals obtained by adding different delay times to different signals obtained by branching a target signal into a plurality of lines, and sampling the signals at a sampling rate of a Nyquist rate; and
converting the sampling sequences into compressed data and outputting the compressed data, and
causing the data compression apparatus to perform:
as converting the sampling sequences into compressed data and outputting the compressed data,
converting the sampling sequences in the lines from time-domain signals into frequency-domain signals;
performing, at one time, phase compensation processing for sub-Nyquist zones of the sampling sequences converted into the frequency-domain signals, and processing to cancel phase rotation due to delay time differences between the sampling sequences;
determining into which sub-Nyquist zone the target signal has been folded and estimating a frequency of the target signal; and
converting a value representing the sub-Nyquist zone and a corresponding amplitude value into the compressed data in a specified data format and outputting the compressed data, wherein
the program causes the data compression apparatus to further perform
sampling the target signal at a sampling rate of the Nyquist rate, and
extracting signals corresponding to specified delay time differences from the sampled target signal.

18. A non-transitory computer-readable storage medium storing a program to control a data decompression apparatus,
the program causing the data decompression apparatus to perform
extracting the value representing the sub-Nyquist zone and the corresponding amplitude value from the compressed data acquired from the data compression apparatus according to claim 1, and restoring an amplitude value corresponding to a frequency before the target signal is folded in the data compression apparatus.

19. A data compression method in a data compression apparatus, the data compression method comprising:
outputting, by a receiver, sampling sequences corresponding to signals obtained by adding different delay times to different signals obtained by branching a target signal into a plurality of lines, and sampling the signals at a sampling rate-less than of a Nyquist rate; and
converting, by an encoder, the sampling sequences into compressed data and outputting, by the encoder, the compressed data,
outputting the compressed data including
converting, by a time-frequency transform circuitry, the sampling sequences in the lines from time-domain signals into frequency-domain signals,
performing, by a signal processing circuitry, at one time, phase compensation processing for sub-Nyquist zones of the sampling sequences converted into the frequency-domain signals, and processing to cancel phase rotation due to delay time differences between the sampling sequences,
determining, by a target frequency estimator, into which sub-Nyquist zone the target signal has been folded and estimating, by the target frequency estimator, a frequency of the target signal, and
converting, by an encoding circuitry, a value representing the sub-Nyquist zone and a corresponding amplitude value into the compressed data in a specified data format and outputting, by the encoding circuitry, the compressed data, wherein
the data compression method further comprises
sampling, by a sampling circuitry, the target signal at a sampling rate of the Nyquist rate, and
extracting, by a signal extraction circuitry, signals corresponding to specified delay time differences from a signal sampled by the sampling circuitry.

20. A data decompression method in a data decompression apparatus, the data decompression method comprising
extracting, by a decoder, the value representing the sub-Nyquist zone and the corresponding amplitude value from the compressed data acquired from the data compression apparatus to perform the data compression method according to claim 19, and restoring, by the decoder, an amplitude value corresponding to a frequency before the target signal is folded in the data compression apparatus.

* * * * *